United States Patent
Dennen

(10) Patent No.: US 6,555,872 B1
(45) Date of Patent: Apr. 29, 2003

(54) TRENCH GATE FERMI-THRESHOLD FIELD EFFECT TRANSISTORS

(75) Inventor: Michael W. Dennen, Raleigh, NC (US)

(73) Assignee: Thunderbird Technologies, Inc., Research Triangle Park, NC (US)

( * ) Notice: Subject to any disclaimer, the term of this patent is extended or adjusted under 35 U.S.C. 154(b) by 45 days.

(21) Appl. No.: 09/718,816

(22) Filed: Nov. 22, 2000

(51) Int. Cl.$^7$ ............................................. H01L 29/784
(52) U.S. Cl. ......................... 257/327; 257/344; 257/336
(58) Field of Search ................................. 257/327, 344, 257/403, 404, 408, 386, 345, 336, 270; 438/294, 226, 225, 217, 222, 223, 224, 161, 149

(56) References Cited

U.S. PATENT DOCUMENTS

| 3,975,221 A | 8/1976 | Rodgers | 148/191 |
| 4,735,918 A | 4/1988 | Parsons et al. | 437/90 |
| 4,835,585 A | 5/1989 | Panousis | 357/23.4 |

(List continued on next page.)

FOREIGN PATENT DOCUMENTS

| JP | 63-287064 | 11/1988 |
| WO | WO 99/17371 | 4/1999 |

OTHER PUBLICATIONS

Schulz et al., *Short–Channel Vertical Sidewall MOSFETs,* IEEE Transactions on Electron Devices, vol. 48, No. 8, Aug. 2001, pp. 1783–1788.

(List continued on next page.)

Primary Examiner—Carl Whitehead, Jr.
Assistant Examiner—Laura M Schillinger
(74) Attorney, Agent, or Firm—Myers Bigel Sibley & Sajovec

(57) ABSTRACT

Field effect transistors include a semiconductor substrate of first conductivity type having a surface. A tub region of second conductivity type is in the semiconductor substrate at the surface and extends into the semiconductor substrate a first depth from the first surface. Spaced apart source and drain regions of the second conductivity type are included in the tub region of second conductivity type at the surface, to define single conductivity junctions of the second conductivity type with the tub region of second conductivity type. The spaced apart source and drain regions extend into the tub region a second depth that is less than the first depth. A trench is included in the tub region, between the spaced apart source and drain regions, and extending from the surface into the tub region to a third depth that is more than the second depth but is less than the first depth. An insulated gate electrode is included in the trench. Source and drain electrodes are provided on the surface that electrically contact the source and drain regions respectively. These field effect transistors may be fabricated by forming a tub region of second conductivity type in a semiconductor substrate of first conductivity type at a surface thereof, and extending into the semiconductor substrate a first depth from the surface. A source/drain region of the second conductivity type is formed in the tub region of second conductivity type at the surface, to define a single conductivity junction of the second conductivity type with the tub region of second conductivity type. The source/drain region extends into the tub region a second depth that is less than the first depth. A trench is formed in the source/drain region, to define spaced apart source and drain regions therefrom. The trench extends from the surface into the tub region a third depth that is more than the second depth but is less than the first depth. An insulated gate electrode is formed in the trench. Source and drain electrodes are formed on the surface that electrically contact the source and drain regions, respectively.

41 Claims, 24 Drawing Sheets

U.S. PATENT DOCUMENTS

| | | | |
|---|---|---|---|
| 4,984,043 A | | 1/1991 | Vinal ..................... 357/23.14 |
| 4,990,974 A | | 2/1991 | Vinal ....................... 357/25.3 |
| 5,108,938 A | | 4/1992 | Solomon .................... 437/41 |
| 5,142,640 A | | 8/1992 | Iwamatsu ................. 357/23.6 |
| 5,194,923 A | | 3/1993 | Vinal ........................ 257/268 |
| 5,206,182 A | * | 4/1993 | Freeman ..................... 437/33 |
| 5,367,186 A | * | 11/1994 | Vinal et al. ................ 257/357 |
| 5,369,295 A | | 11/1994 | Vinal ........................ 257/288 |
| 5,374,836 A | * | 12/1994 | Vinal et al. ................ 257/344 |
| 5,434,435 A | | 7/1995 | Baliga ....................... 257/141 |
| 5,440,160 A | * | 8/1995 | Vinal ........................ 257/327 |
| 5,510,630 A | * | 4/1996 | Agarwal et al. .............. 257/77 |
| 5,543,654 A | * | 8/1996 | Dennan ..................... 257/386 |
| 5,583,361 A | | 12/1996 | Morishita |
| 5,698,884 A | | 12/1997 | Dennen ..................... 257/345 |
| 5,814,869 A | | 9/1998 | Dennen ..................... 257/408 |
| 5,885,876 A | * | 3/1999 | Dennan ..................... 438/294 |
| 5,960,270 A | | 9/1999 | Misra et al. ................ 438/197 |
| 6,049,107 A | | 4/2000 | Peidous |

OTHER PUBLICATIONS

Shenai, *Optimized Trench MOSFET Technologies for Power Devices,* IEEE Transactions on Electron Devices, vol. 39, No. 6, Jun. 1992, pp. 1435–1443.

International Search Report, PCT/US01/46746, Aug. 9, 2002.

Mimura et al., *New Structure of Enchancement–Mode GaAs Microwave M.O.S.F.E.T.,* Electronics Letters, IEE Stevenage, GB, vol. 14, No. 16, Aug. 3, 1978. pp. 500–502.

* cited by examiner

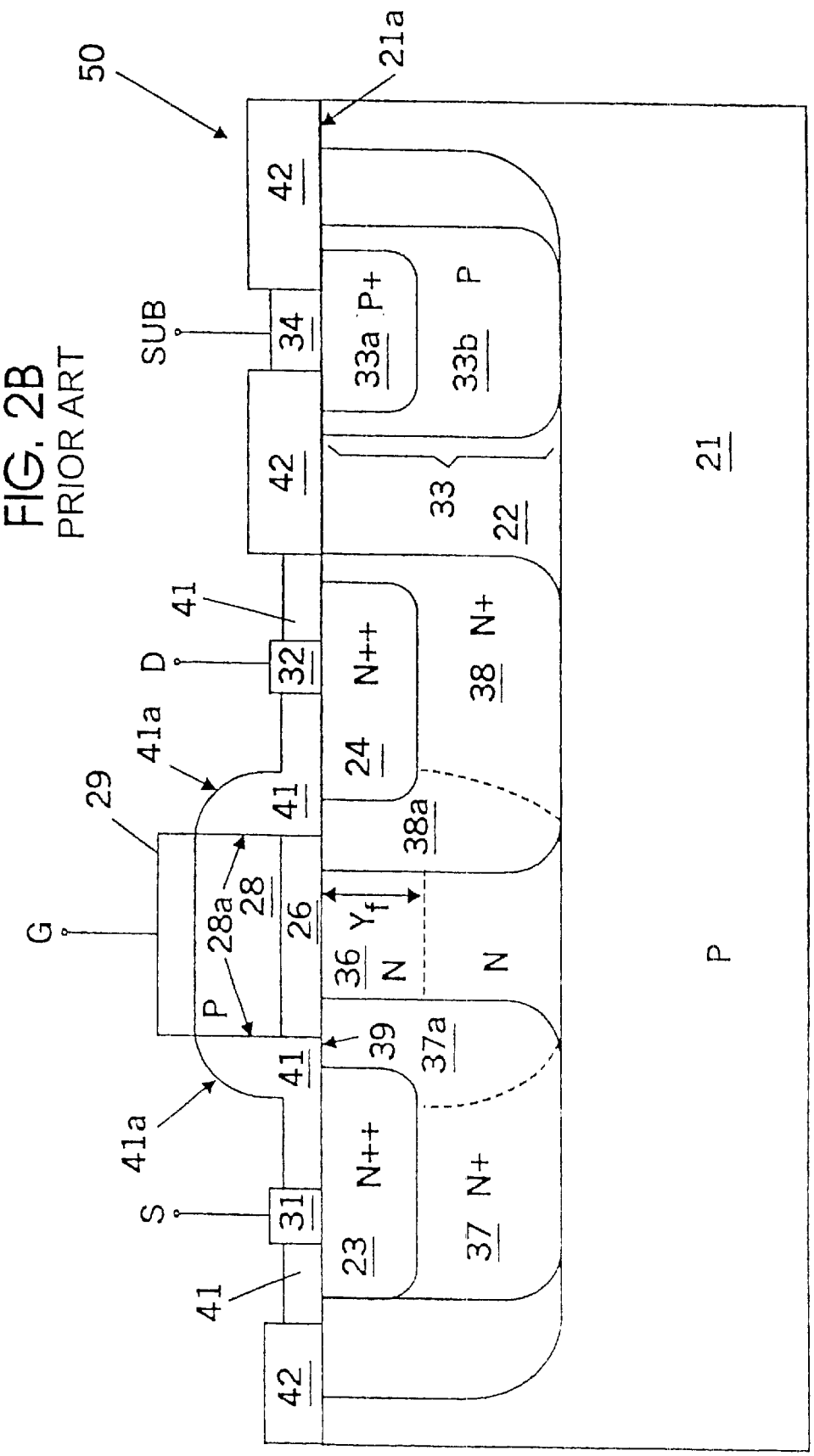

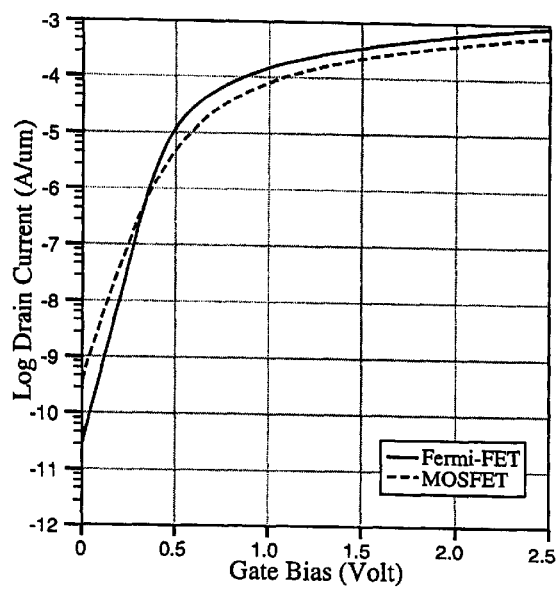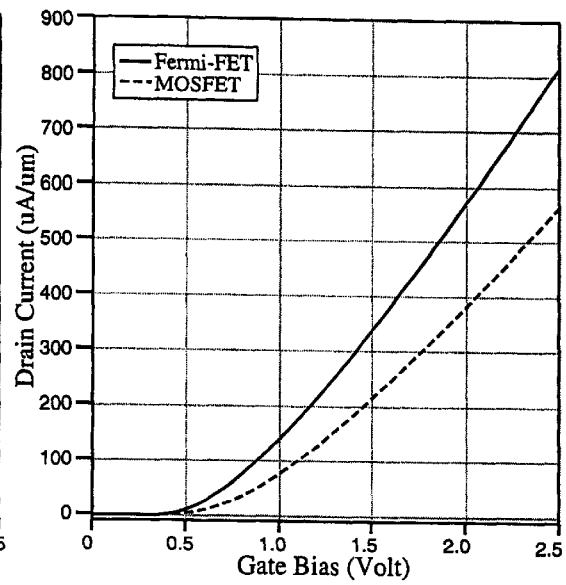
FIG. 14A
FIG. 14B

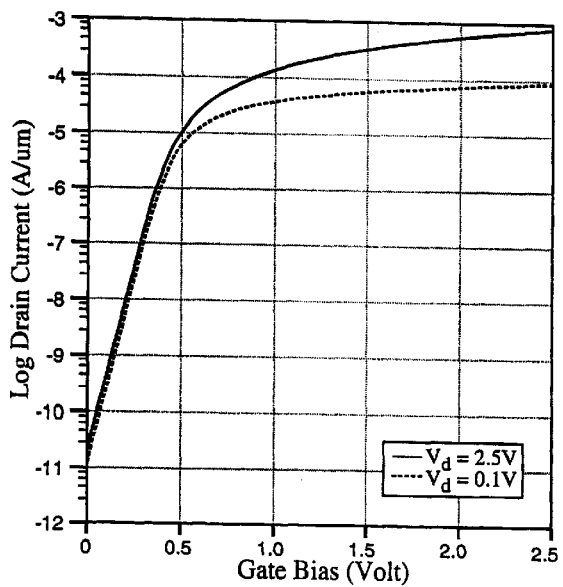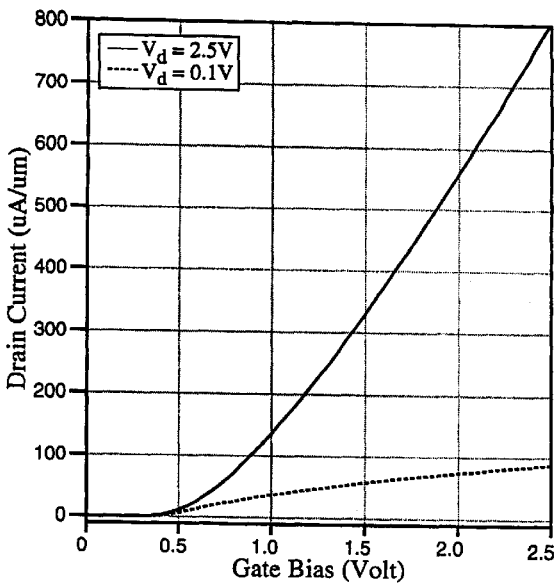
FIG. 15A
FIG. 15B

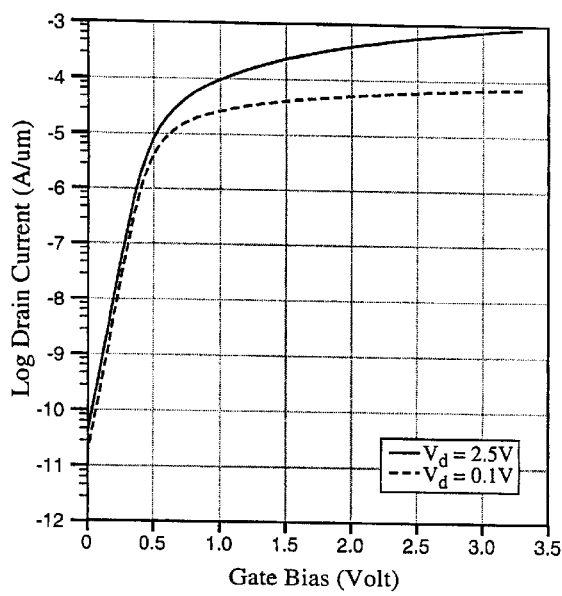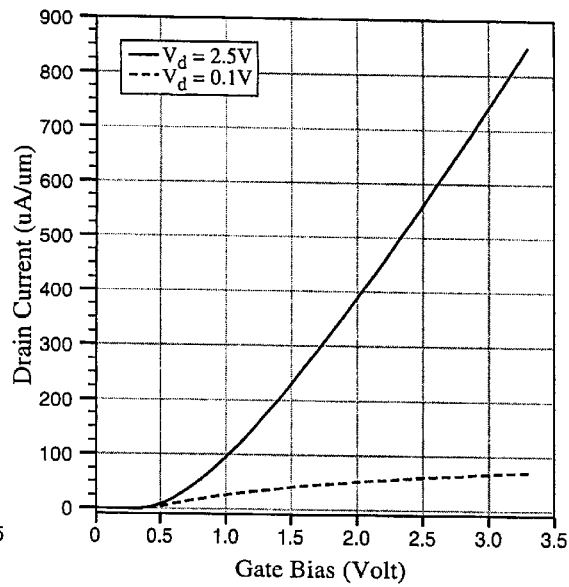
FIG. 16A
FIG. 16B

TRENCH GATE FERMI-THRESHOLD FIELD EFFECT TRANSISTORS

FIELD OF THE INVENTION

This invention relates to transistor devices and fabrication methods therefor, and more particularly to field effect transistors and fabrication methods therefor.

BACKGROUND OF THE INVENTION

Field effect transistors (FET) have become the dominant active device for very large scale integration (VLSI) and ultra large scale integration (ULSI) applications, such as logic devices, memory devices and microprocessors, because the integrated circuit FET is by nature a high impedance, high density, low power device. Much research and development activity has focused on improving the speed and integration density of FETs, and on lowering the power consumption thereof. FETs also are widely used as power devices, such as power amplifiers. Much research and development activity has focused on improving the speed and efficiency of FETs that are used as power devices, particularly at high frequencies, for wired and wireless applications.

A high speed, high performance field effect transistor is described in U.S. Pat. Nos. 4,984,043 and 4,990,974, both by Albert W. Vinal, both entitled Fermi Threshold Field Effect Transistor and both assigned to the assignee of the present invention. These patents describe a metal oxide semiconductor field effect transistor (MOSFET) which operates in the enhancement mode without requiring inversion, by setting the device's threshold voltage to twice the Fermi potential of the semiconductor material. As is well known to those having skill in the art, Fermi potential is defined as that potential for which an energy state in a semiconductor material has a probability of one-half of being occupied by an electron. As described in the above mentioned Vinal patents, when the threshold voltage is set to twice the Fermi potential, the dependence of the threshold voltage on oxide thickness, channel length, drain voltage and substrate doping is substantially eliminated. Moreover, when the threshold voltage is set to twice the Fermi potential, the vertical electric field at the substrate face between the oxide and channel is minimized, and is in fact substantially zero. Carrier mobility in the channel is thereby maximized, leading to a high speed device with greatly reduced hot electron effects.

Notwithstanding the vast improvement of the Fermi-threshold FET compared to known FET devices, there was a need to lower the capacitance of the Fermi-FET device. Accordingly, in U.S. Pat. Nos. 5,194,923 and 5,369,295, both by Albert W. Vinal, and both entitled Fermi Threshold Field Effect Transistor With Reduced Gate and Diffusion Capacitance, a Fermi-FET device is described which allows conduction carriers to flow within the channel at a predetermined depth in the substrate below the gate, without requiring an inversion layer to be created at the surface of the semiconductor in order to support carrier conduction. Accordingly, the average depth of the channel charge requires inclusion of the permittivity of the substrate as part of the gate capacitance. Gate capacitance is thereby substantially reduced.

As described in the aforesaid '295 and '923 patents, the low capacitance Fermi-FET is preferably implemented using a Fermi-tub region having a predetermined depth and a conductivity type opposite the substrate and the same conductivity type as the drain and source. The Fermi-tub extends downward from the substrate surface by a predetermined depth, and the drain and source diffusions are formed in the Fermi-tub within the tub boundaries. The Fermi-tub forms a unijunction transistor, in which the source, drain, channel and Fermi-tub are all doped the same conductivity type, but at different doping concentrations. A low capacitance Fermi-FET is thereby provided. The low capacitance Fermi-FET including the Fermi-tub will be referred to herein as a "low capacitance Fermi-FET" or a "Tub-FET".

Notwithstanding the vast improvement of the Fermi-FET and the low capacitance Fermi-FET compared to known FET devices, there was a continuing need to increase the current per unit channel width which is produced by the Fermi-FET. As is well known to those skilled in the art, higher current Fermi-FET devices will allow greater integration density, and/or much higher speeds for logic devices, memory devices, microprocessors and other integrated circuit devices. Accordingly, U.S. Pat. No. 5,374,836 to Albert W. Vinal and the present inventor Michael W. Dennen entitled High Current Fermi-Threshold Field Effect Transistor, describes a Fermi-FET which includes an injector region of the same conductivity type as the Fermi-tub region and the source region, adjacent the source region and facing the drain region. The injector region is preferably doped at a doping level which is intermediate to the relatively low doping concentration of the Fermi-tub and the relatively high doping concentration of the source. The injector region controls the depth of the carriers injected into the channel and enhances injection of carriers in the channel, at a predetermined depth below the gate. Transistors according to U.S. Pat. No. 5,374,836 will be referred to herein as a "high current Fermi-FET".

Preferably, the source injector region is a source injector tub region which surrounds the source region. A drain injector tub region may also be provided. A gate sidewall spacer which extends from adjacent the source injector region to adjacent the gate electrode of the Fermi-FET may also be provided in order to lower the pinch-off voltage and increase saturation current for the Fermi-FET. A bottom leakage control region of the same conductivity type as the substrate may also be provided.

Notwithstanding the vast improvement of the Fermi-FET, the low capacitance Fermi-FET and the high current Fermi-FET compared to known FET devices, there was a continuing need to improve operation of the Fermi-FET at low voltages. As is well known to those having skill in the art, there is currently much emphasis on low power portable and/or battery-powered devices which typically operate at power supply voltages of five volts, three volts, one volt or less.

For a given channel length, lowering of the operating voltage causes the lateral electric field to drop linearly. At very low operating voltages, the lateral electric field is so low that the carriers in the channel are prevented from reaching saturation velocity. This results in a precipitous drop in the available drain current. The drop in drain current effectively limits the decrease in operating voltage for obtaining usable circuit speeds for a given channel length.

In order to improve operation of the Tub-FET at low voltages, U.S. Pat. No. 5,543,654 to the present inventor Michael W. Dennen entitled Contoured-Tub Fermi-Threshold Field Effect Transistor and Method of Forming Same, describes a Fermi-FET which includes a contoured Fermi-tub region having nonuniform tub depth. In particular, the Fermi-tub is deeper under the source and/or drain regions than under the channel region. Thus, the tub-substrate junction is deeper under the source and/or drain regions than under the channel region. Diffusion capacitance is thereby reduced compared to a Fermi-tub having a uniform tub depth, so that high saturation current is produced at low voltages.

In particular, a contoured-tub Fermi-threshold field effect transistor according to the '654 patent includes a semiconductor substrate of first conductivity type and spaced-apart source and drain regions of second conductivity type in the semiconductor substrate at a face thereof. A channel region of the second conductivity type is also formed in the semiconductor substrate at the substrate face between the spaced-apart source and drain regions. A tub region of the second conductivity type is also included in the semiconductor substrate at the substrate face. The tub region extends a first predetermined depth from the substrate face to below at least one of the spaced-apart source and drain regions, and extends a second predetermined depth from the substrate face to below the channel region. The second predetermined depth is less than the first predetermined depth. A gate insulating layer and source, drain and gate contacts are also included. A substrate contact may also be included.

Preferably, the second predetermined depth, i.e. the depth of the contoured-tub adjacent the channel, is selected to satisfy the Fermi-FET criteria as defined in the aforementioned U.S. Pat. Nos. 5,194,923 and 5,369,295. In particular, the second predetermined depth is selected to produce zero static electric field perpendicular to the substrate face at the bottom of the channel with the gate electrode at ground potential. The second predetermined depth may also be selected to produce a threshold voltage for the field effect transistor which is twice the Fermi potential of the semiconductor substrate. The first predetermined depth, i.e. the depth of the contoured-tub region adjacent the source and/or drain is preferably selected to deplete the tub region under the source and/or drain regions upon application of zero bias to the source and/or drain contact.

As the state of the art in microelectronic fabrication has progressed, fabrication linewidths have been reduced to substantially less than one micron. These decreased linewidths have given rise to the "short channel" FET wherein the channel length is substantially less than one micron and is generally less than one half micron with current processing technology.

The low capacitance Fermi-FET of U.S. Pat. Nos. 5,194,923 and 5,369,295, the high current Fermi-FET of U.S. Pat. No. 5,374,836 and the contoured tub Fermi-FET of U.S. Pat. No. 5,543,654 may be used to provide a short channel FET with high performance capabilities at low voltages. However, it will be recognized by those having skill in the art that as linewidths decrease, processing limitations may limit the dimensions and conductivities which are attainable in fabricating an FET. Accordingly, for decreased linewidths, processing conditions may require reoptimization of the Fermi-FET transistor to accommodate these processing limitations.

Reoptimization of the Fermi-FET transistor to accommodate processing limitations was provided in U.S. Pat. No. 5,814,869 to the present inventor Michael W. Dennen and entitled "Short Channel Fermi-Threshold Field Effect Transistors"; assigned to the assignee of the present invention, the disclosure of which is hereby incorporated herein by reference. The Short Channel Fermi-FET of U.S. Pat. No. 5,814,869, referred to herein as the "short channel Fermi-FET", includes spaced-apart source and drain regions which extend beyond the Fermi-tub in the depth direction and which may also extend beyond the Fermi-tub in the lateral direction. Since the source and drain regions extend beyond the tub, a junction with the substrate is formed which can lead to a charge-sharing condition. In order to compensate for this condition, the substrate doping is increased. The very small separation between the source and drain regions leads to a desirability to reduce the tub depth. This causes a change in the static electrical field perpendicular to the substrate at the oxide:substrate interface when the gate electrode is at threshold potential. In typical long channel Fermi-FET transistors, this field is essentially zero. In short channel devices the field is significantly lower than a MOSFET transistor, but somewhat higher than a long channel Fermi-FET.

In particular, a short channel Fermi-FET includes a semiconductor substrate of first conductivity type and a tub region of second conductivity type in the substrate at a surface thereof which extends a first depth from the substrate surface. The short channel Fermi-FET also includes spaced-apart source and drain regions of the second conductivity type in the tub region. The spaced-apart source and drain regions extend from the substrate surface to beyond the first depth, and may also extend laterally away from one another to beyond the tub region.

A channel region of the second conductivity type is included in the tub region, between the spaced-apart source and drain regions and extending a second depth from the substrate surface such that the second depth is less than the first depth. At least one of the first and second depths are selected to minimize the static electric field perpendicular to the substrate surface, from the substrate surface to the second depth when the gate electrode is at threshold potential. For example, a static electric field of $10^4$ V/cm may be produced in a short channel Fermi-FET compared to a static electric field of more than $10^5$ V/cm in a conventional MOSFET. In contrast, the Tub-FET of U.S. Pat. Nos. 5,194,923 and 5,369,295 may produce a static electric field of less than (and often considerably less than) $10^3$ V/cm which is essentially zero when compared to a conventional MOSFET. The first and second depths may also be selected to produce a threshold voltage for the field effect transistor which is twice the Fermi-potential of the semiconductor substrate, and may also be selected to allow carriers of the second conductivity type to flow from the source region to the drain region in the channel region at the second depth upon application of the threshold voltage to the gate electrode, and extending from the second depth toward the substrate surface upon application of voltage to the gate electrode beyond the threshold voltage of the field effect transistor, without creating an inversion layer in the channel. The transistor further includes a gate insulating layer and source, drain and gate contacts. A substrate contact may also be included.

Continued miniaturization of integrated circuit field effect transistors has reduced the channel length to well below one micron. This continued miniaturization of the transistor has often required very high substrate doping levels. High doping levels and the decreased operating voltages which may be required by the smaller devices, may cause a large increase in the capacitance associated with the source and drain regions of both the Fermi-FET and conventional MOSFET devices.

In particular, as the Fermi-FET is scaled to below one micron, it is typically necessary to make the tub depth substantially shallower due to increased Drain Induced Barrier Lowering (DIBL) at the source. Unfortunately, even with the changes described above for the short channel Fermi-FET, the short channel Fermi-FET may reach a size where the depths and doping levels which are desired to control Drain Induced Barrier Lowering and transistor leakage become difficult to manufacture. Moreover, the high doping levels in the channel may reduce carrier mobility which also may reduce the high current advantage of the Fermi-FET technology. The ever higher substrate doping levels, together with the reduced drain voltage may also cause an increase in the junction capacitance.

A short channel Fermi-FET that can overcome these potential problems was provided in application Ser. No. 5,698,884 to the present inventor Michael W. Dennen and entitled "Short Channel Fermi-Threshold Field Effect Transistors Including Drain Field Termination Region and Methods of Fabricating Same" assigned to the assignee of the present invention, the disclosure of which is hereby incorporated herein by reference. This Fermi-FET includes drain field terminating means between the source and drain regions for reducing and preferably preventing injection of carriers from the source region into the channel as a result of drain bias. A short channel Fermi-FET including drain field terminating means, referred to herein as a "Vinal-FET" in memory of the now deceased inventor of the Fermi-FET, prevents excessive Drain Induced Barrier Lowering while still allowing low vertical field in the channel, similar to a Fermi-FET. In addition, the Vinal-FET permits much higher carrier mobility and simultaneously leads to a large reduction in source and drain junction capacitance.

The drain field terminating means is preferably embodied by a buried contra-doped layer between the source and drain regions and extending beneath the substrate surface from the source region to the drain region. In particular, a Vinal-FET includes a semiconductor substrate of first conductivity type and a tub region of second conductivity type in the substrate at a surface thereof. Spaced apart source and drain regions of the second conductivity type are included in the tub region at the substrate surface. A buried drain field terminating region of the first conductivity type is also included in the tub region. The buried drain field terminating region extends beneath the substrate surface from the source region to the drain region. A gate insulating layer and source, drain and gate electrodes are also included. Accordingly, the Vinal-FET may be regarded as a Fermi-FET with an added contra-doped buried drain field terminating region which prevents drain bias from causing carriers to be injected from the source region into the tub region.

As the channel length and integration density of integrated circuit field effect transistors continues to increase, the operating voltages of the transistors has also continued to decrease. This decrease is further motivated by the increasing use of integrated circuits in portable electronic devices, such as laptop computers, cellular telephones, personal digital assistants and the like. As the operating voltage of the field effect transistors decrease, it is also generally desirable to lower the threshold voltage.

Accordingly, in order to provide short channel Fermi-FETs for low voltage operation, it is desirable to reduce the threshold voltage, for example to about half a volt or less. However, this reduction in threshold voltage should not produce performance degradation in other areas of the Fermi-FET. For example, a reduction in threshold voltage should not unduly increase the leakage current of the Fermi-FET, or unduly decrease the saturation current of the Fermi-FET.

A Fermi-FET that can provide low voltage operation is described in Published PCT Application No. WO 99/17371 entitled Metal Gate Fermi-Threshold Field Effect Transistors to the present inventor Dennen and William R. Richards, assigned to the assignee of the present invention, the disclosure of which is hereby incorporated herein by reference. As described therein, a Fermi-threshold field effect transistor includes a metal gate. A contra-doped polysilicon gate is not used directly on the gate insulating layer. The metal gate can lower the threshold voltage of the Fermi-FET without degrading other desirable characteristics of the Fermi-FET. Preferably, the metal gate comprises metal having a work function between that of P-type polysilicon and N-type polysilicon. More preferably, the metal gate comprises metal having a work function of about 4.85 volts, i.e. midway between the work function of P-type polysilicon and N-type polysilicon.

As the channel length of field effect transistors continues to decrease, for example to sub-micron and sub-tenth micron dimensions, undesirable short channel effects may continue to increase. It may be desirable to produce very shallow source and drain regions in an attempt to reduce the short channel effects. However, it may become increasingly difficult to produce shallow source/drain regions, so that short channel effects may play an increasing role in reducing the performance of Fermi-threshold field effect transistors.

SUMMARY OF THE INVENTION

Embodiments of the present invention include Fermi-threshold field effect transistors (Fermi-FET) that include a trench in the tub region and an insulated gate electrode in the trench. These transistors, referred to herein as trench gate Fermi-FETs, can provide reduced short channel effects without the need for hyper-shallow source and drain profiles. High breakdown voltages and/or lower source and drain parasitic capacitances also may be provided.

Field effect transistors according to embodiments of the invention include a semiconductor substrate of first conductivity type having a surface. A tub region of second conductivity type is in the semiconductor substrate at the surface and extends into the semiconductor substrate a first depth from the first surface. Spaced apart source and drain regions of the second conductivity type are included in the tub region of second conductivity type at the surface, to define single conductivity junctions of the second conductivity type with the tub region of second conductivity type. The spaced apart source and drain regions extend into the tub region a second depth that is less than the first depth. A trench is included in the tub region, between the spaced apart source and drain regions, and extending from the surface into the tub region to a third depth that is more than the second depth but is less than the first depth. An insulated gate electrode is included in the trench. Source and drain electrodes are provided on the surface that electrically contact the source and drain regions respectively.

In some embodiments, at least one of the first, second and third depths are selected to produce zero static electric field perpendicular to the surface at the third depth. In other embodiments, at least one of the first, second and third depths are selected to produce zero static electric field perpendicular to the surface at the third depth upon application of the threshold voltage of the field effect transistor to the insulated gate electrode.

In yet other embodiments, at least one of the first, second and third depths are selected to produce the static electric field of less than 700V per centimeter, perpendicular to the surface at the third depth. In other embodiments, at least one of the first, second and third depths are selected to produce a static electric field perpendicular to the surface at the third depth that is at least an order of magnitude less than that produced by a field effect transistor that does not include the tub region. In still other embodiments, at least one of the first, second and third depths are selected to produce a static electric field perpendicular to the surface at the third depth that is less than one half of that produced by a field effect transistor that does not include the tub region. In yet other embodiments, at least one of the first, second and third depths are selected to produce a static electric field perpendicular to the surface at the third depth that is less than one fifth of that produced by a field effect transistor that does not include the tub region. In other embodiments, these static electric fields are produced perpendicular to the surface at the third depth upon application of the threshold voltage of the field effect transistor to the insulated gate electrode.

In yet other embodiments, at least one of the first, second and third depths are selected to produce a threshold voltage for the field effect transistor that is twice the Fermi potential of the semiconductor substrate.

In still other embodiments, at least one of the first, second and third depths are selected to allow carriers of the second conductivity type to flow in the tub region, beneath the trench at the third depth, upon application of the threshold voltage of the field effect transistor to the gate electrode. In still other embodiments, at least one of the first, second and third depths are selected to allow carriers of the second conductivity type to flow in the tub region, beneath the trench and extending from the third depth towards the first depth upon application of voltage to the gate electrode beyond the threshold voltage of the field effect transistor.

In yet other embodiments, the trench defines a trench width, and at least one of the first, second and third depths are selected to form a channel in the tub region beneath the trench, and having a channel length that is proportional to the trench width and that is independent of a difference between the first depth and the second depth. In yet other embodiments, at least one of the first, second and third depths are selected to deplete the tub region beneath the trench from the third depth to the first depth.

In still other embodiments, the trench includes a trench floor and the insulated gate includes an insulating layer having a thickness on the trench floor and a gate electrode on the insulating layer opposite the trench floor. At least one of the first, second and third depths are selected to produce threshold voltage for the field effect transistor that is independent of the thickness of the insulating layer on the trench floor. In still other embodiments, the trench defines a trench width and at least one of the first, second and third depths are selected to form a channel in the tub region upon application of the threshold voltage of the field effect transistor to the gate electrode, wherein the channel is confined to beneath the trench, extends across the trench width and has uniform thickness beneath the trench and across the trench width.

In still other embodiments, the third depth is less than the first depth by an amount that is equal to:

$$\sqrt{\frac{2\varepsilon_s kT}{q}\left(\frac{N_a}{N_d N_a + N_d^2}\right)\ln\left(\frac{N_d N_a}{n_i^2}\right)},$$

where $N_d$ is the doping density of the tub region, $N_a$ is the doping density of the semiconductor substrate, $N_i$ is the intrinsic carrier concentration of the substrate at temperature T degrees Kelvin, $\varepsilon_s$ is the permittivity of the substrate, q is $1.6 \times 10^{-19}$ coulombs and k is $1.38 \times 10^{-23}$ Joules/degree Kelvin.

The semiconductor substrate in all of the above-described embodiments may actually be a well region of first conductivity type that itself is in a semiconductor substrate of second conductivity type, at the surface, such that the tub region of second conductivity type is in the well region of first conductivity type at the surface, and extends into the well region a first depth from the surface.

Moreover, in all of the above-described embodiments, the insulated gate electrode may be in the trench and recessed beneath the surface. In some embodiments, the insulated gate electrode is recessed beneath the surface by an amount that minimizes capacitance between the insulated gate electrode and the spaced apart source and drain regions, without reducing drain current in the field effect transistor.

In still other embodiments, the semiconductor substrate is doped a first conductivity type at a first doping density and the tub region is doped the second conductivity type at a second doping density. At least one of the first, second and third depths and the first and second doping densities are selected according to any of the embodiments that are described above.

Field effect transistors may be fabricated, according to embodiments of the invention, by forming a tub region of second conductivity type in a semiconductor substrate of first conductivity type at a surface thereof, and extending into the semiconductor substrate a first depth from the surface. A source/drain region of the second conductivity type is formed in the tub region of second conductivity type at the surface, to define a single conductivity junction of the second conductivity type with the tub region of second conductivity type. The source/drain region extends into the tub region a second depth that is less than the first depth. A trench is formed in the source/drain region, to define spaced apart source and drain regions therefrom. The trench extends from the surface into the tub region a third depth that is more than the second depth but is less than the first depth. An insulated gate electrode is formed in the trench. Source and drain electrodes are formed on the surface that electrically contact the source and drain regions, respectively.

In other embodiments, the source/drain region is formed prior to forming the tub region. In yet other embodiments, the trench is formed after forming the source/drain region and forming the tub region. In still other embodiments, the insulated gate electrode is formed prior to forming the source and drain electrodes. In all of the above-described method embodiments, the first, second and third depths and/or the first and second doping densities are selected as was described in any of the structural embodiments that were described above. Moreover, a well region of first conductivity type may be formed in a semiconductor substrate of second conductivity type, and the tub region of second conductivity type may be formed in the well region of first conductivity type, as was described above. Finally, the insulated gate electrode may be recessed beneath the surface, as was described above.

In these method embodiments, the source/drain region may be formed by implanting ions of the second conductivity type into the semiconductor substrate at a large tilt angle. This can allow shallow source/drain regions to be produced, but need not cause misalignment because the gate electrode is formed after the source/drain region is produced. The gate electrode therefore may not act to shadow the source/drain implants. Moreover, the insulated gate electrode may be formed by lining the trench with an insulating layer and forming a gate electrode in the trench that is lined with the insulating layer. The gate electrode may be formed by forming a gate electrode layer on the surface and in the trench, and planarizing the gate electrode layer to remove the gate electrode layer from the surface. The planarizing may be followed by recessing the gate electrode beneath the surface.

The trench (third) depth may be determined by forming trench gate Fermi-FET field effect transistors and measuring the parameters thereof Moreover, the trench depth may be determined by simulation. Empirical methods also may be used to determine the trench depth according to embodiments of the invention, by performing a series of capacitance vs. voltage measurements on a series of sites having a tub region and a source/drain region therein, wherein the source/drain region is etched by differing amounts in the series of sites. The sites may be on a single wafer or on multiple wafers. The trench depth may be determined by determining a maximum depth that allows a maximum capacitance to be obtained at negative voltages.

BRIEF DESCRIPTION OF THE DRAWINGS

FIG. 2B illustrates a cross-sectional view of a second embodiment of a short channel low leakage current Fermi-FET according to U.S. Pat. No. 5,374,836.

FIGS. 14A and 14B graphically illustrate drain current vs. gate voltage characteristics of simulated trench gate Fermi-FETs according to embodiments of the invention vs. simulated conventional FETs, in logarithmic and linear forms, respectively.

FIGS. 15A and 15B illustrate transistor characteristics for simulated trench gate Fermi-FETs according to embodiments of the invention in logarithmic and linear form, respectively.

FIGS. 16A and 16B graphically illustrate simulation results for trench gate Fermi-FET transistors according to embodiments of the invention as a function of a change of the gate insulating layer thickness.

DETAILED DESCRIPTION OF PREFERRED EMBODIMENTS

Figure 1:
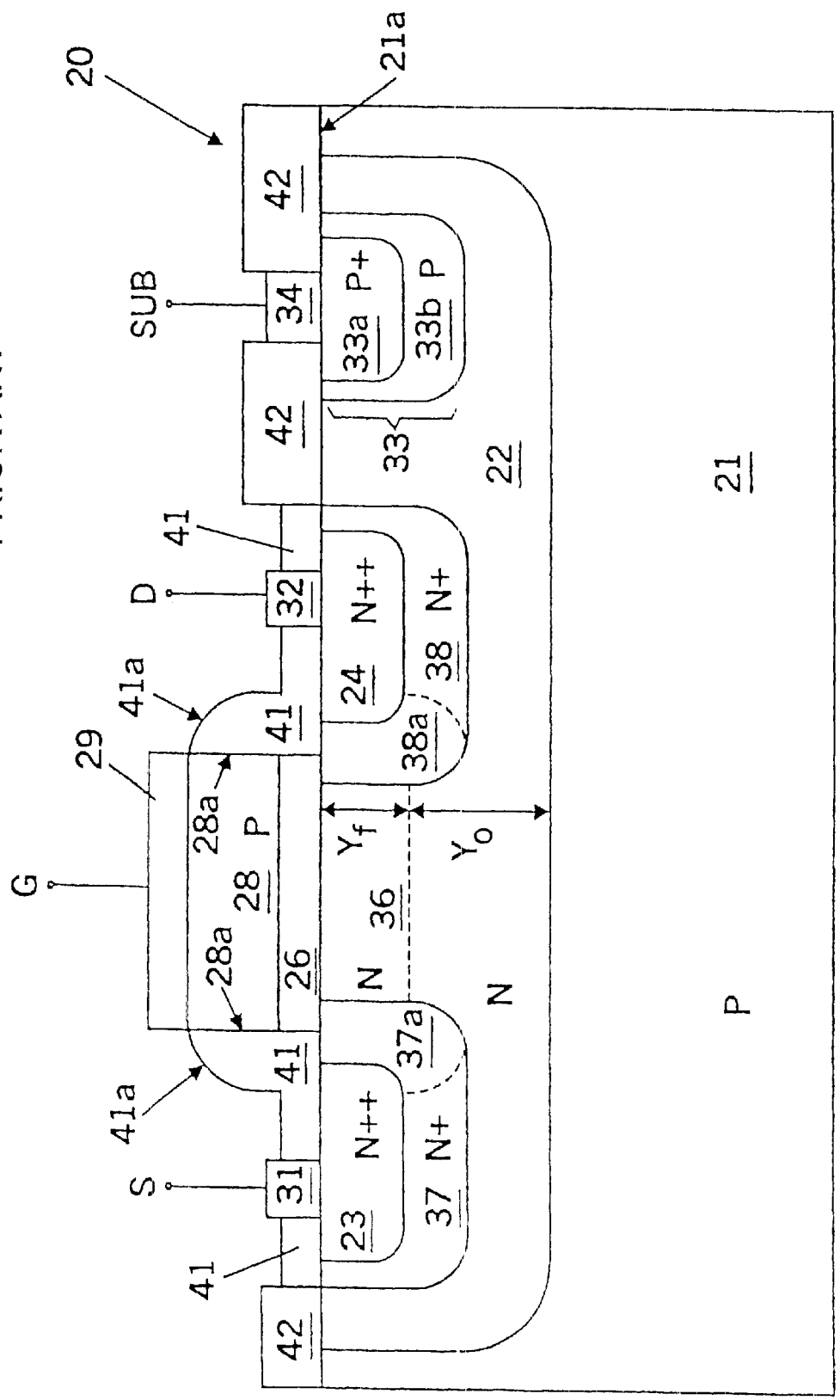
FIG. 1 illustrates a cross-sectional view of an N-channel high current Fermi-FET according to U.S. Pat. No. 5,374,836.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present.

Before describing trench gate Fermi-threshold field effect transistors of the present invention, a Fermi-threshold field effect transistor with reduced gate and diffusion capacitance of U.S. Pat. Nos. 5,194,923 and 5,369,295 (also referred to as the "low capacitance Fermi-FET" or the "Tub-FET") will be described as will a high current Fermi-Threshold field effect transistor of U.S. Pat. No. 5,374,836. A contoured-tub Fermi-FET according to U.S. Pat. No. 5,543,654 will also be described. Short channel Fermi-FETs of U.S. Pat. No. 5,814, 869 will also be described. Vinal-FETs of U.S. Pat. No. 5,698,884 will also be described. Metal gate Fermi-FETs of published PCT Application No. WO 99/17371 will also be described. A more complete description may be found in these patents and applications, the disclosures of which are hereby incorporated herein by reference. Trench gate Fermi-FETs according to embodiments of the present invention will then be described.

Fermi-FET With Reduced Gate and Diffusion Capacitance

The following summarizes the low capacitance Fermi-FET including the Fermi-tub. Additional details may be found in U.S. Pat. Nos. 5,194,923 and 5,369,295.

Conventional MOSFET devices require an inversion layer to be created at the surface of the semiconductor in order to support carrier conduction. The depth of the inversion layer is typically 100 Å or less. Under these circumstances gate capacitance is essentially the permittivity of the gate insulator layer divided by its thickness. In other words, the channel charge is so close to the surface that effects of the dielectric properties of the substrate are insignificant in determining gate capacitance.

Gate capacitance can be lowered if conduction carriers are confined within a channel region below the gate, where the average depth of the channel charge requires inclusion of the permittivity of the substrate to calculate gate capacitance. In general, the gate capacitance of the low capacitance Fermi-FET is described by the following equation:

$$C_g = \frac{1}{\frac{Y_f}{\beta \varepsilon_s} + \frac{T_{ox}}{\varepsilon_i}} \quad (1)$$

where $Y_f$ is the depth of the conduction channel called the Fermi channel, $\varepsilon_s$ is the permittivity of the substrate, and $\beta$ is the factor that determines the average depth of the charge flowing within the Fermi channel below the surface. $\beta$ depends on the depth dependent profile of carriers injected from the source into the channel. For the low capacitance Fermi-FET, $\beta \cong 2$. $T_{ox}$ is the thickness of the gate oxide layer and $\varepsilon_i$ is its permittivity.

The low capacitance Fermi-FET includes a Fermi-tub region of predetermined depth, having conductivity type opposite the substrate conductivity type and the same conductivity type as the drain and source regions. The Fermi-tub extends downward from the substrate surface by a predetermined depth, and the drain and source diffusions are formed in the Fermi-tub region within the Fermi-tub boundaries. The preferred Fermi-tub depth is the sum of the Fermi channel depth $Y_f$ and depletion depth $Y_0$. A Fermi channel region with predetermined depth $Y_f$ and width Z, extends between the source and drain diffusions. The conductivity of the Fermi channel is controlled by the voltage applied to the gate electrode.

The gate capacitance is primarily determined by the depth of the Fermi channel and the carrier distribution in the Fermi channel, and is relatively independent of the thickness of the gate oxide layer. The diffusion capacitance is inversely dependent on the difference between [the sum of the depth of the Fermi-tub and the depletion depth $Y_0$ in the substrate] and the depth of the diffusions $X_d$. The diffusion depth is preferably less than the depth of the Fermi-tub, $Y_T$. The dopant concentration for the Fermi-tub region is preferably chosen to allow the depth of the Fermi channel to be greater than three times the depth of an inversion layer within a MOSFET.

Accordingly, the low capacitance Fermi-FET includes a semiconductor substrate of first conductivity type having a first surface, a Fermi-tub region of second conductivity type in the substrate at the first surface, spaced apart source and drain regions of the second conductivity type in the Fermi-tub region at the first surface, and a channel of the second conductivity type in the Fermi-tub region at the first surface between the spaced apart source and drain regions. The channel extends a first predetermined depth ($Y_f$) from the first surface and the tub extends a second predetermined depth ($Y_0$) from the channel. A gate insulating layer is provided on the substrate at the first surface between the spaced apart source and drain regions. Source, drain and gate electrodes are provided for electrically contacting the source and drain regions and the gate insulating layer respectively.

At least the first and second predetermined depths are selected to produce zero static electric field perpendicular to the first surface at the first depth, upon application of the threshold voltage of the field effect transistor to the gate electrode. The first and second predetermined depths are also selected to allow carriers of the second conductivity type to flow from the source to the drain in the channel, extending from the first predetermined depth toward the first surface upon application of the voltage to the gate electrode beyond the threshold voltage of the field effect transistor. The carriers flow from the source to the drain region beneath the first surface without creating an inversion layer in the Fermi-tub region. The first and second predetermined depths are also selected to produce a voltage at the substrate surface, adjacent the gate insulating layer, which is equal and opposite to the sum of the voltages between the substrate contact and the substrate and between the polysilicon gate electrode and the gate electrode.

When the substrate is doped at a doping density $N_s$, has an intrinsic carrier concentration $n_i$ at temperature T degrees Kelvin and a permittivity $\varepsilon_s$, and the field effect transistor includes a substrate contact for electrically contacting the substrate, and the channel extends a first predetermined depth $Y_f$ from the surface of the substrate and the Fermi-tub region extends a second predetermined depth $Y_0$ from the channel, and the Fermi-tub region is doped at a doping density which is a factor $\alpha$ times $N_s$, and the gate electrode includes a polysilicon layer of the first conductivity type and which is doped at a doping density $N_p$, the first predetermined depth ($Y_f$) is equal to:

$$Y_f = \sqrt{\frac{2\varepsilon_s}{qN_s\alpha} \frac{kT}{q} \text{Ln}\left(\frac{N_p}{N_s}\right)}, \quad (2)$$

where q is $1.6 \times 10^{-19}$ coulombs and K is $1.38 \times 10^{-23}$ Joules/°Kelvin. The second predetermined depth ($Y_0$) is equal to:

$$Y_o = \sqrt{\frac{2\varepsilon_s \phi_s}{qN_s\alpha(\alpha+1)}} \quad (3)$$

where $\phi_s$ is equal to $2\phi_f + kT/q$ Ln($\alpha$), and $\phi_f$ is the Fermi potential of the semiconductor substrate.

High Current Fermi-FET Structure

Referring now to FIG. 1, an N-channel high current Fermi-FET according to U.S. Pat. No. 5,374,836 is illustrated. It will be understood by those having skill in the art that a P-channel Fermi-FET may be obtained by reversing the conductivities of the N and P regions.

As illustrated in FIG. 1, high current Fermi-FET 20 is fabricated in a semiconductor substrate 21 having first conductivity type, here P-type, and including a substrate surface 21a. A Fermi-tub region 22 of second conductivity type, here N-type, is formed in the substrate 21 at the surface 21a. Spaced apart source and drain regions 23 and 24, respectively, of the second conductivity type, here N-type, are formed in the Fermi-tub region 22 at the surface 21a. It will be understood by those having skill in the art that the source and drain regions may also be formed in a trench in the surface 21a.

A gate insulating layer 26 is formed on the substrate 21 at the surface 21a between the spaced apart source and drain regions 23 and 24, respectively. As is well known to those having skill in the art, the gate insulating layer is typically silicon dioxide. However, silicon nitride and other insulators may be used.

A gate electrode is formed on gate insulating layer 26, opposite the substrate 21. The gate electrode preferably includes a polycrystalline silicon (polysilicon) gate electrode layer 28 of first conductivity type, here P-type. A conductor gate electrode layer, typically a metal gate electrode layer 29, is formed on polysilicon gate electrode 28 opposite gate insulating layer 26. Source electrode 31 and drain electrode 32, typically metal, are also formed on source region 23 and drain region 24, respectively.

A substrate contact 33 of first conductivity type, here P-type, is also formed in substrate 21, either inside Fermi-tub 22 as shown or outside tub 22. As shown, substrate contact 33 is doped first conductivity type, here P-type, and may include a relatively heavily doped region 33a and a relatively lightly doped region 33b. A substrate electrode 34 establishes electrical contact to the substrate.

The structure heretofore described with respect to FIG. 1 corresponds to the low capacitance Fermi-FET structure of U.S. Pat. Nos. 5,194,923 and 5,369,295. As already described in these applications, a channel 36 is created between the source and drain regions 23 and 24. The depth of the channel from the surface 21a, designated at $Y_f$ in FIG. 1, and the depth from the bottom of the channel to the bottom of the Fermi-tub 22, designated as $Y_0$ in FIG. 1, along with the doping levels of the substrate 21, tub region 22, and polysilicon gate electrode 28 are selected to provide a high performance, low capacitance field effect transistor using the relationships of Equations (2) and (3) above.

Still referring to FIG. 1, a source injector region 37a of second conductivity type, here N-type, is provided adjacent the source region 23 and facing the drain region. The source injector region provides a high current, Fermi-FET by controlling the depth at which carriers are injected into channel 36. The source injector region 37a may only extend between the source region 23 and the drain region 24. The source injector region preferably surrounds source region 23 to form a source injector tub region 37, as illustrated in FIG. 1. Source region 23 may be fully surrounded by the source injector tub region 37, on the side and bottom surface. Alternatively, source region 23 may be surrounded by the source injector tub region 37 on the side, but may protrude through the source injector tub region 37 at the bottom. Still alternatively, source injector region 37a may extend into substrate 21, to the junction between Fermi-tub 22 and substrate 21. A drain injector region 38a, preferably a drain injector tub region 38 surrounding drain region 24, is also preferably provided.

Source injector region 37a and drain injector region 38a or source injector tub region 37 and drain injector tub region 38, are preferably doped the second conductivity type, here N-type, at a doping level which is intermediate the relatively low doping level of Fermi-tub 22 and the relatively high doping level of source 23 and drain 24. Accordingly, as illustrated in FIG. 1, Fermi-tub 22 is designated as being N, source and drain injector tub regions 37, 38 are designated as $N^+$ and source and drain regions 23, 24 are designated as $N^{++}$. A unijunction transistor is thereby formed.

The high current Fermi-FET provides drive currents that are about four times that of state of the art FETs. Gate capacitance is about half that of a conventional FET device. The doping concentration of the source injector tub region 37 controls the depth of carriers injected into the channel region 36, typically to about 1000 Å. The source injector tub region 37 doping concentration is typically 2E18, and preferably has a depth at least as great as the desired maximum depth of injected majority carriers. Alternatively, it may extend as deep as the Fermi-tub region 22 to minimize subthreshold leakage current, as will be described below. It will be shown that the carrier concentration injected into the channel 36 cannot exceed the doping concentration of the source injector region 37a facing the drain. The width of the portion of source injector region 37a facing the drain is typically in the range of 0.05–0.15 μm. The doping concentration of the source and drain regions 23 and 24 respectively, is typically 1E19 or greater. The depth $Y_T = (Y_f + Y_0)$ of the Fermi-tub 22 is approximately 2200 Å with a doping concentration of approximately 1.8E16.

As illustrated in FIG. 1, the high current Fermi-FET 20 also includes a gate sidewall spacer 41 on the substrate surface 21a, which extends from adjacent the source injector region 37a to adjacent the polysilicon gate electrode 28. Gate sidewall spacer 41 also preferably extends from adjacent the drain injector region 38a to adjacent the polysilicon gate electrode 28. In particular, as shown in FIG. 1, gate sidewall spacer 41 extends from the polysilicon gate electrode sidewall 28a and overlies the source and drain injector regions 37a and 38a respectively. Preferably the gate sidewall spacer 41 surrounds the polysilicon gate electrode 28. Also preferably, and as will be discussed in detail below, the gate insulating layer 26 extends onto the source injector region 37a and the drain injector region 38a at the substrate face 21a and the gate sidewall spacer 41 also extends onto the source injector region 37 and drain injector region 38.

The gate sidewall spacer 41 lowers the pinch-off voltage of the Fermi-FET 20 and increases its saturation current in a manner in which will be described in detail below. Preferably, the gate sidewall spacer is an insulator having a permittivity which is greater than the permittivity of the gate insulating layer 26. Thus, for example, if the gate insulating layer 26 is silicon dioxide, the gate sidewall spacer is preferably silicon nitride. If the gate insulating layer 26 is silicon nitride, the gate sidewall spacer is preferably an insulator which has permittivity greater than silicon nitride.

As shown in FIG. 1, the gate sidewall spacer 41 may also extend onto source and drain regions 23 and 24 respectively, and the source and drain electrodes 31 and 32 respectively may be formed in the extension of the gate sidewall spacer region. Conventional field oxide or other insulator 42 regions separate the source, drain and substrate contacts. It will also be understood by those having skill in the art that although the outer surface 41a of gate sidewall spacer 41 is illustrated as being curved in cross section, other shapes may be used, such as a linear outer surface to produce a triangular cross section or orthogonal outer surfaces to produce a rectangular cross section.

Low Leakage Current Fermi-Threshold Field Effect Transistor

Figure 2A:
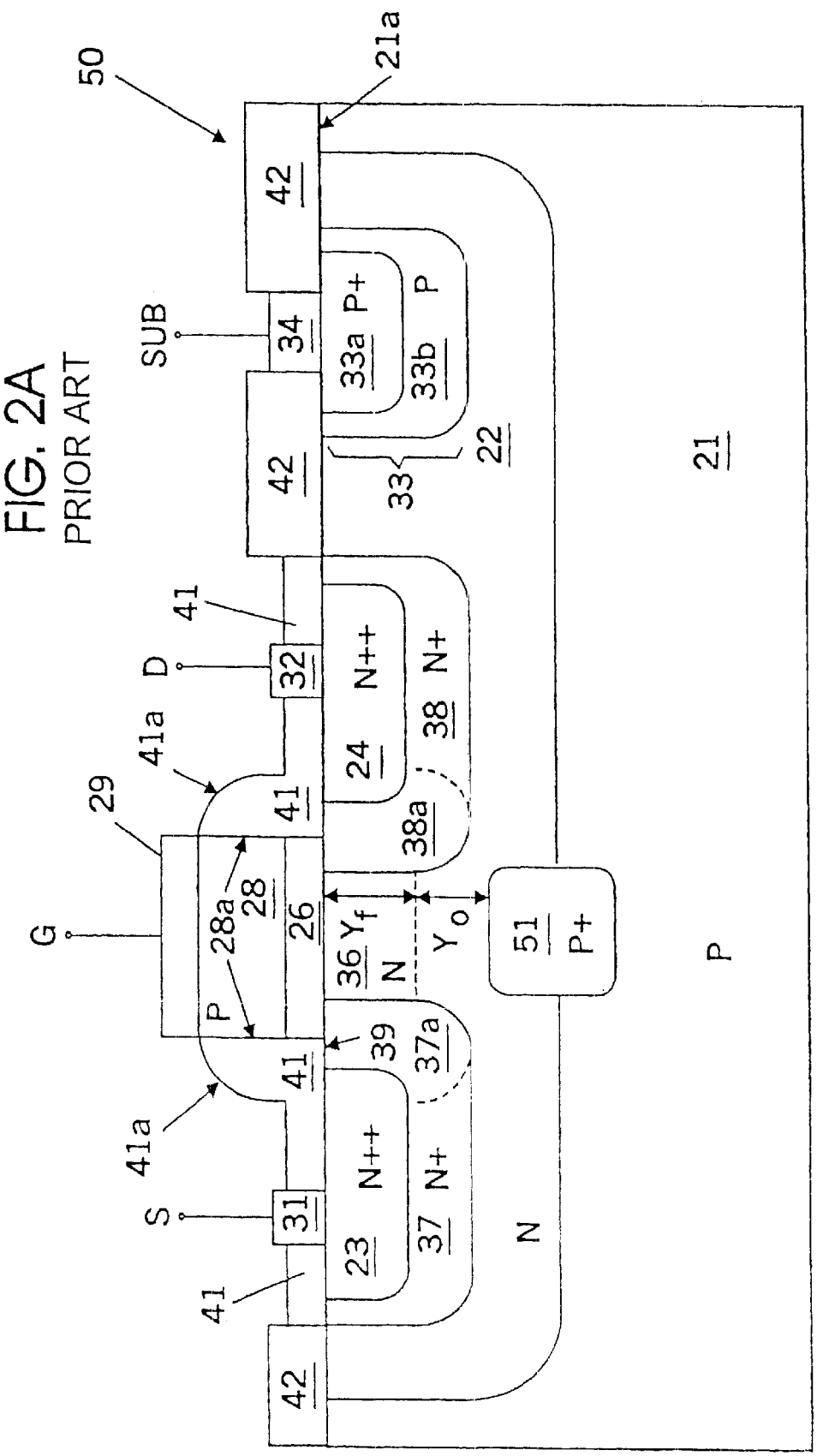
FIG. 2A illustrates a cross-sectional view of a first embodiment of a short channel low leakage current Fermi-FET according to U.S. Pat. No. 5,374,836.

Referring now to FIGS. 2A and 2B, Fermi-FETs which have short channels yet produce low leakage current, according to U.S. Pat. No. 5,374,836 will now be described. These devices will hereinafter be referred to as "low leakage current Fermi-FETs". The low leakage current Fermi-FET 50 of FIG. 2A includes a bottom leakage current control region 51 of first conductivity type, here P conductivity type, and doped at a high concentration relative to the substrate 21. Accordingly, it is designated as P⁺ in FIG. 2A. The low leakage current Fermi-FET 60 of FIG. 2B includes extended source and drain injector regions 37a, 38a, which preferably extend to the depth of the Fermi-tub 22.

Referring now to FIG. 2A, bottom leakage current control region 51 extends across the substrate 21 from between an extension of the facing ends of the source and drain regions 23 and 24, and extends into the substrate from above the depth of the Fermi-tub 22 to below the depth of the Fermi-tub. Preferably, it is located below, and in alignment with the Fermi-channel 36. For consistency with the equations previously described, the depth from the Fermi-channel 36 to the top of the bottom current leakage current control region 51 has been labeled $Y_0$. The remainder of the Fermi-FET transistor of FIG. 2A is identical with that described in FIG. 1, except that a shorter channel is illustrated. It will be understood by those having skill in the art that injector regions 37a and 38a and/or injector tubs 37 and 38 may be omitted, as may the gate sidewall spacer region 41, to provide a low leakage current low capacitance, short channel Fermi-FET without the high current properties of the device of FIG. 2A.

The bottom leakage current control region 51 minimizes drain induced injection in short channel Fermi field effect transistors, i.e. those field effect transistors having a channel length of approximately 0.5 μm or less, while maintaining low diffusion depletion capacitance. For example, at 5 volts, leakage current of 3E-13A or less may be maintained.

The bottom leakage current control region may be designed using Equations (2) and (3) where $Y_0$ is the depth from the channel to the top of the bottom leakage control region as shown in FIGS. 2A and 2B. Factor a is the ratio between the P⁺ doping of the bottom leakage current control region 51 and the N doping of the Fermi-tub 22. Preferably a is set to about 0.15 within the bottom leakage control region, i.e. below the gate 28. Below the source and drain regions 23 and 24, α is set to about 1.0 to minimize diffusion depletion capacitance. In other words, the doping concentrations of substrate 21 and Fermi-tub 22 are about equal in the regions below the source and drain. Accordingly, for the design parameters described above, and for a channel width of 0.5 micron, the doping concentration in the bottom leakage control region 51 is approximately 5E17 and is deep enough to support partial depletion at the tub-junction region given 5 volt drain or source diffusion potential.

Referring now to FIG. 2B, an alternate design for bottom leakage control extends the depth of source injector region 37a and drain injector region 38a, preferably to the depth of the Fermi-tub ($Y_f + Y_0$). As shown in FIG. 2B, the depth of the entire source injector tub 37 and drain injector tub 38 may be extended, preferably to the depth of the Fermi-tub. The separation distance between the bottom of the injector tubs 37 and 38 and the bottom of the Fermi-tub 22 is preferably less than half the channel length and preferably approaches zero. Under these conditions, injector tubs 37 and 38 have doping concentration of about 1.5E18/cm³. The depth of substrate contact region 33b also preferably is extended to approach the Fermi-tub depth. The remainder of the Fermi-FET transistor 60 of FIG. 2B is identical with that described in FIG. 1, except that a shorter channel is illustrated.

Contoured-Tub Fermi-Threshold Field Effect Transistor

Figure 3:
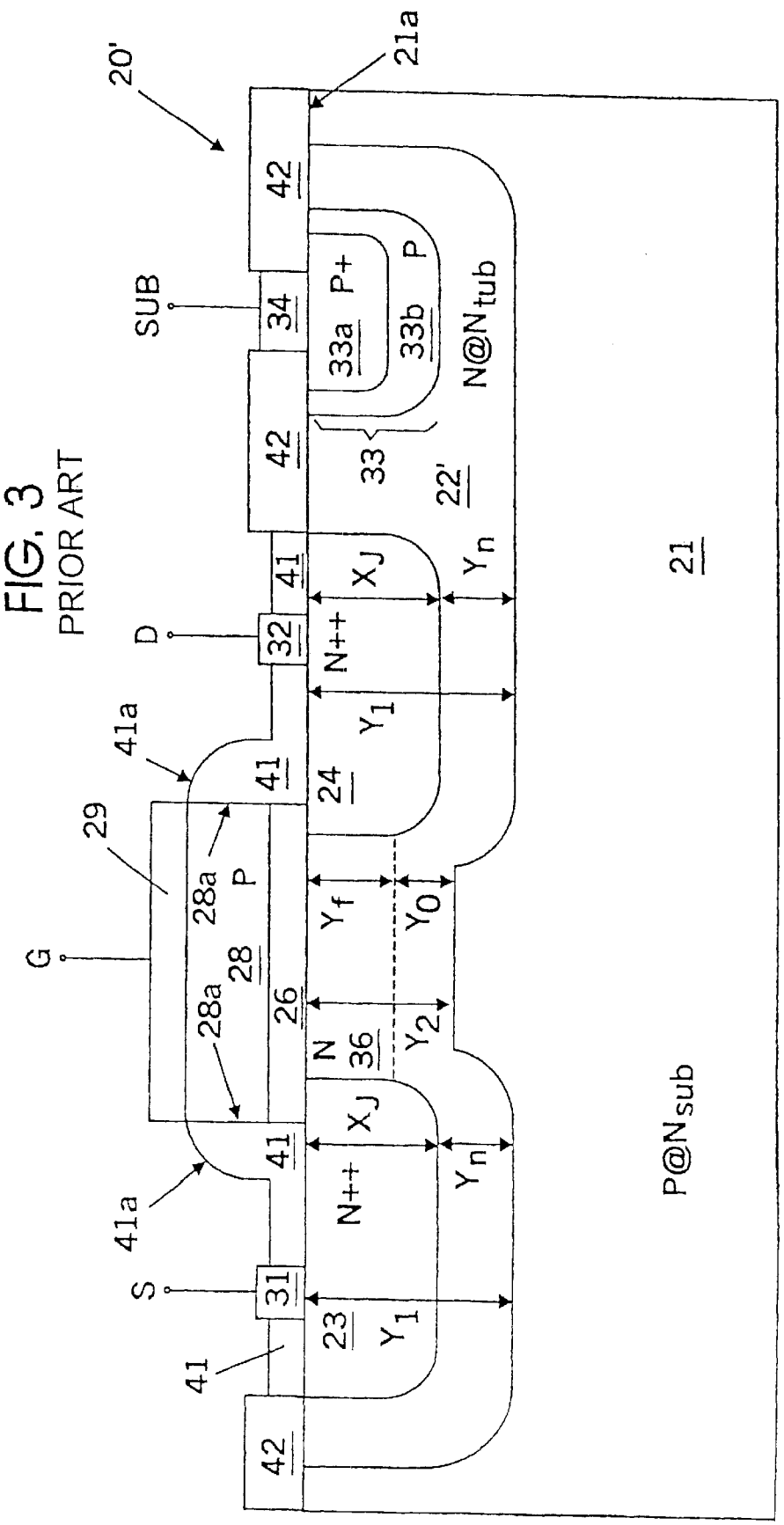
FIG. 3 illustrates a cross-sectional view of an N-channel contoured-tub Fermi-FET according to U.S. Pat. No. 5,543,654.

Referring now to FIG. 3, an N-channel contoured-tub Fermi-FET according to U.S. Pat. No. 5,543,654 is illustrated. It will be understood by those having skill in the art that a P-channel Fermi-FET may be obtained by reversing the conductivities of the N and P regions. As illustrated in FIG. 3, contoured-tub Fermi-FET 20' is similar to high current Fermi-FET 20 of FIG. 1, except that a contoured-tub 22' is present rather than the tub 22 of FIG. 1 which has a uniform tub depth. Injector tubs and injector regions are not shown, although they may be present.

Still referring to FIG. 3, contoured-tub 22' has a first predetermined depth $Y_1$ from the substrate face 21a to below at least one of the spaced-apart source and drain regions 23, 24 respectively. The contoured-tub 22' has a second predetermined depth $Y_2$ from the substrate face 21a to below the channel region 36. According to the invention, $Y_2$ is different from, and preferably less than, $Y_1$ so as to create a contoured-tub 22'. Stated another way, the junction between tub 22' and substrate 21 is pushed downward, away from source and drain regions 23 and 24, relative to the position dictated by the tub-FET criteria under the channel, to reduce the source/drain diffusion capacitance and thereby allow the contoured-tub Fermi-FET to operate at low voltages. It will be understood by those having skill in the art that tub 22' may only be contoured under source region 23 or drain region 24 to produce an asymmetric device. However, symmetric devices in which the tub is contoured under source 23 and drain 24 are preferably formed.

The second predetermined depth $Y_2$ is selected based on the low capacitance Fermi-FET (Tub-FET) criteria of U.S. Pat. Nos. 5,194,923 and 5,369,295. These criteria, which determine the depths $Y_f$ and $Y_0$, and which together form the second predetermined depth $Y_2$, are described above.

The first predetermined depth ($Y_1$) is selected to be greater than the second predetermined depth $Y_2$. Preferably, the first predetermined depth is also selected to deplete the tub region 22' between the first predetermined depth $Y_1$ and the source and/or drain regions when zero voltage is applied to the source contact 31 and drain contact 32 respectively. Thus, the entire region labeled $Y_n$ is preferably totally depleted under zero source bias or drain bias respectively. Based on this criteria, $Y_1$ is determined by:

$$Y_n = \sqrt{\frac{kT}{q}\text{Ln}\left(\frac{N_{sub}N_{tub}}{n_i^2}\right)\frac{2\varepsilon_s}{qN_{sub}}\frac{1}{\left(1+\frac{N_{sub}}{N_{tub}}\right)}} \quad (4)$$

where $N_{sub}$ is the doping concentration of the substrate 21 and $N_{tub}$ is the doping concentration of the contoured-tub 22'.

Short Channel Fermi-FETs

Figure 4:
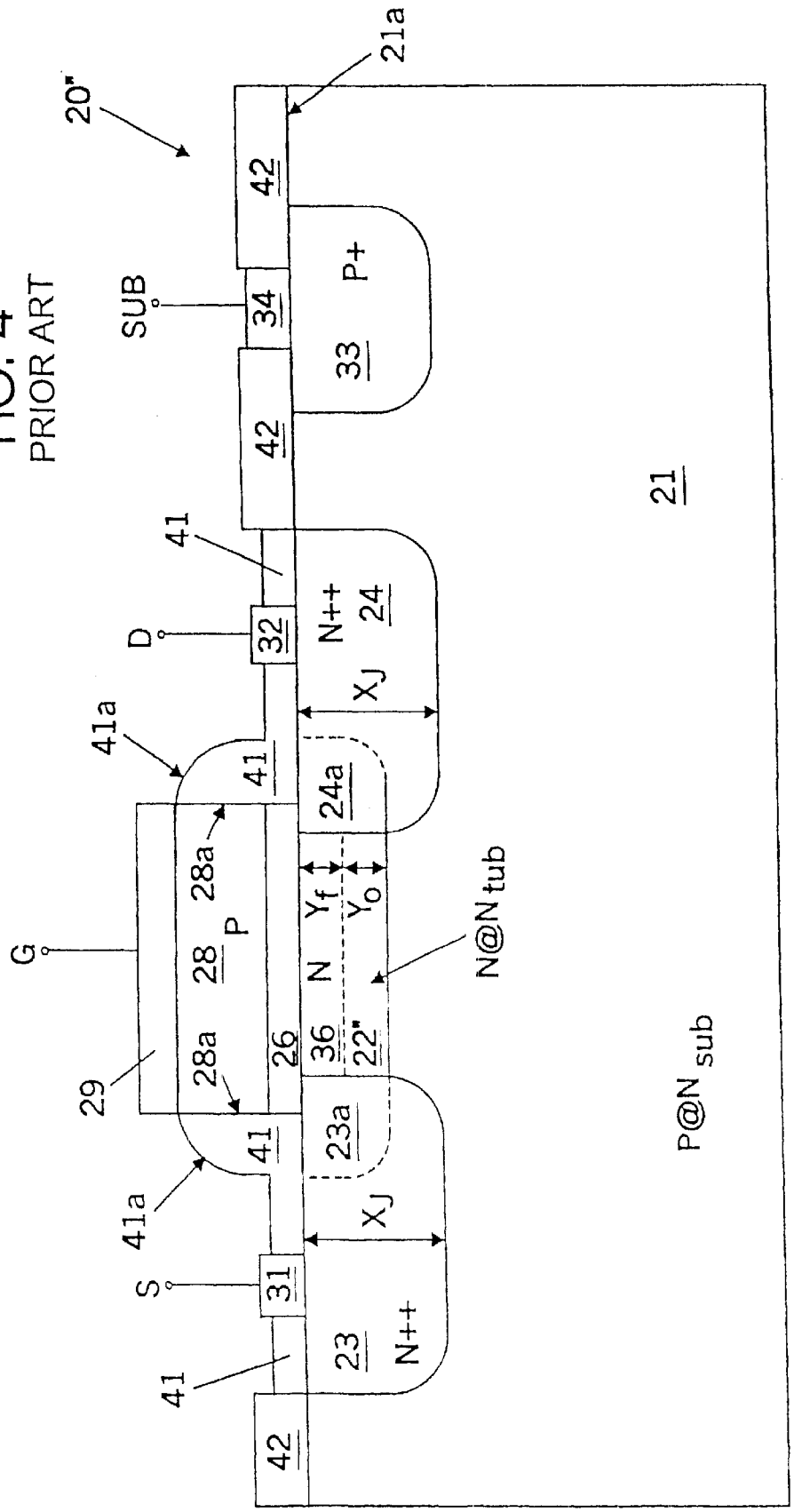
FIG. 4 illustrates a cross-sectional view of an N-channel short channel Fermi-FET according to U.S. Pat. No. 5,543,654.

Referring now to FIG. 4, a short channel N-channel Fermi-FET 20" according to U.S. Pat. No. 5,814,869 is illustrated. It will be understood by those having skill in the art that a P-channel short channel Fermi-FET may be obtained by reversing the conductivities of the N and P regions. As shown in FIG. 4, Fermi-tub 22" extends a first depth ($Y_f + Y_0$) from the substrate surface 21a. The spaced-apart source and drain regions 23 and 24 respectively are located in the tub region, as shown by regions 23a and 24a. However, the source and drain regions 23 and 24 respectively also extend from the substrate surface 21a to beyond the tub depth. Source and drain regions 23 and 24 also extend laterally in a direction along substrate surface 21a, to beyond the tub region.

The channel depth $Y_f$ and the tub depth from the channel $Y_0$ are selected to minimize the static electric field perpendicular to the substrate surface in the channel 36 from the substrate surface to the depth $Y_f$ when the gate electrode is at threshold potential. As already described, these depths are also preferably selected to produce a threshold voltage for the field effect transistor which is twice the Fermi potential of the semiconductor substrate 21. These depths are also selected to allow carriers of the second conductivity type to flow from the source region to the drain region in the channel region, extending from the depth $Y_f$ toward the substrate surface 21a upon application of voltage to the gate electrode beyond the threshold voltage of the field effect transistor. Carriers flow within the channel region from the source region to the drain region underneath the substrate surface without creating an inversion layer in the channel. Accordingly, while not optimum, the device of FIG. 4 can still produce saturation currents far higher than traditional MOSFET transistors, with significant reductions in off-state gate capacitance. Drain capacitance becomes similar to standard MOSFET devices.

It will be understood that in FIG. 4, the source and drain regions extend beyond the tub region in the depth direction orthogonal to substrate face 21a, and also in the lateral direction parallel to substrate face 21a. However, in order to decrease the parasitic sidewall capacitance, the tub 22" preferably extends laterally beyond the source and drain regions, so that the source and drain regions only project through the tub in the depth direction.

Figure 5:
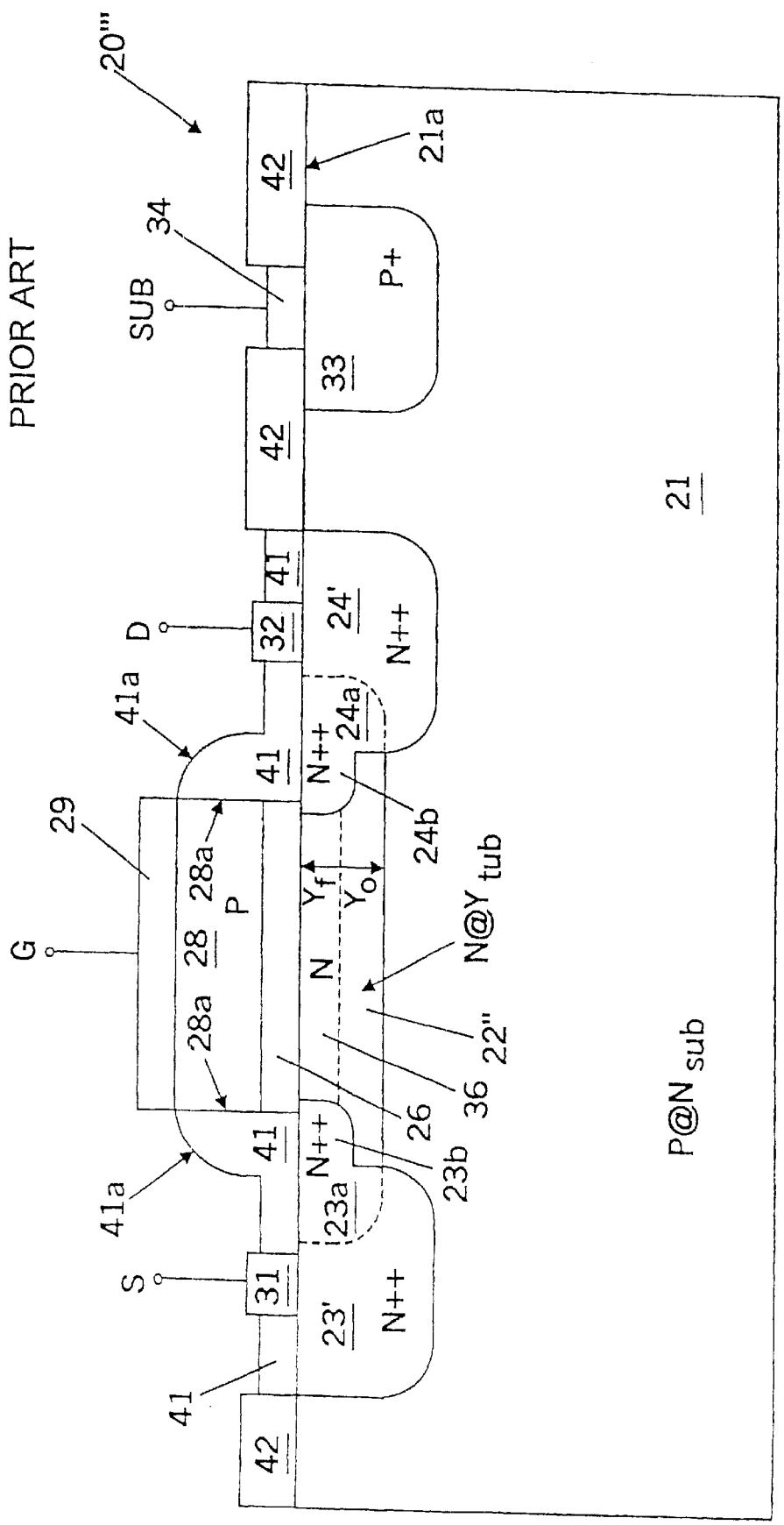
FIG. 5 illustrates a cross-sectional view of a second embodiment of an N-channel short channel Fermi-FET according to U.S. Pat. No. 5,814,869.

Referring now to FIG. 5, a second embodiment of a short channel Fermi-FET according to U.S. Pat. No. 5,814,869 is illustrated. Transistor 20''' is similar to transistor 20" of FIG. 4 except that source and drain extension regions 23b and 24b respectively are provided in the substrate 21 at the substrate face 21a adjacent the source region and drain regions 23' and 24' respectively, extending into channel 36.

As shown in FIG. 5, source and drain extension regions 23b and 24b respectively are heavily doped ($N^{++}$), at approximately the same doping concentration as source and drain regions 23' and 24'. It will be understood that the extensions 23b and 24b are not lightly doped as are lightly doped drain structures of conventional MOSFET devices. Rather, they are doped at the same doping concentration as the source and drain region, and are preferably as highly doped as practical in order to reduce leakage and improve saturation current.

The source and drain extension regions 23b and 24b reduce drain voltage sensitivity due to the charge sharing described above. Unfortunately, the device of FIG. 5 will generally not display as low a capacitance as the fully enclosed source and drain regions of FIGS. 1 and 2. It will be understood by those having skill in the art that in order to preserve the dimensions of the source/drain extension regions 23b and 24b, a heavy, slow moving dopant such as arsenic or indium is preferably used for the source and drain extension regions rather than a lighter, faster moving element which is typically used for the source and drain regions themselves.

Short Channel Fermi-FET Including Drain Field Termination

The architecture of short channel Fermi-threshold field effect transistors including drain field termination regions, also referred to herein as Vinal-FETs, according to U.S. Pat. No. 5,698,884, will now be described. It will be understood by those having skill in the art that P-channel Vinal-FETs may be obtained by reversing the conductivity of the N- and P-regions.

Figure 6:
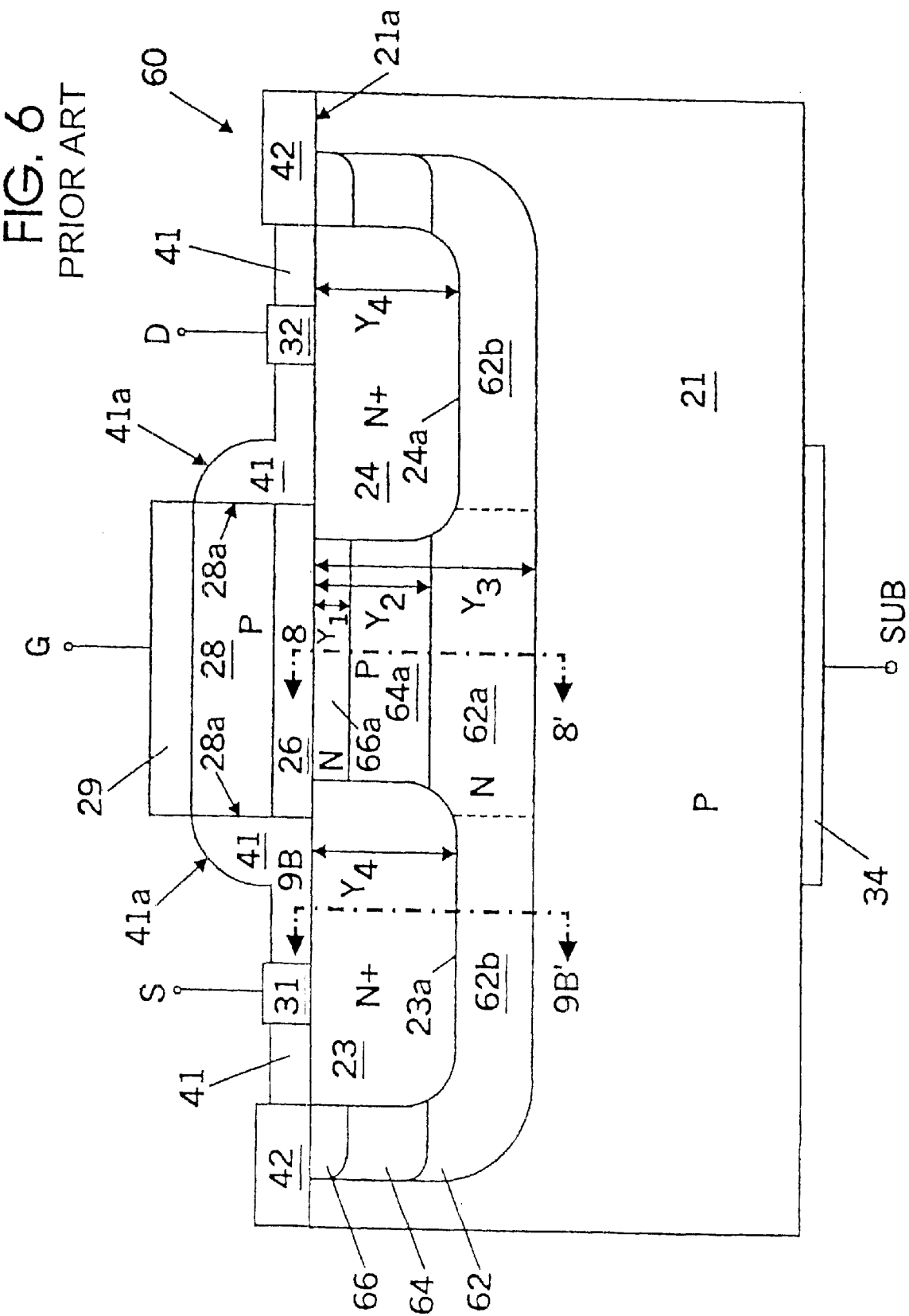
FIG. 6 illustrates a cross-sectional view of a first embodiment of a Vinal-FET according to U.S. Pat. No. 5,698,884.
Figure 7:
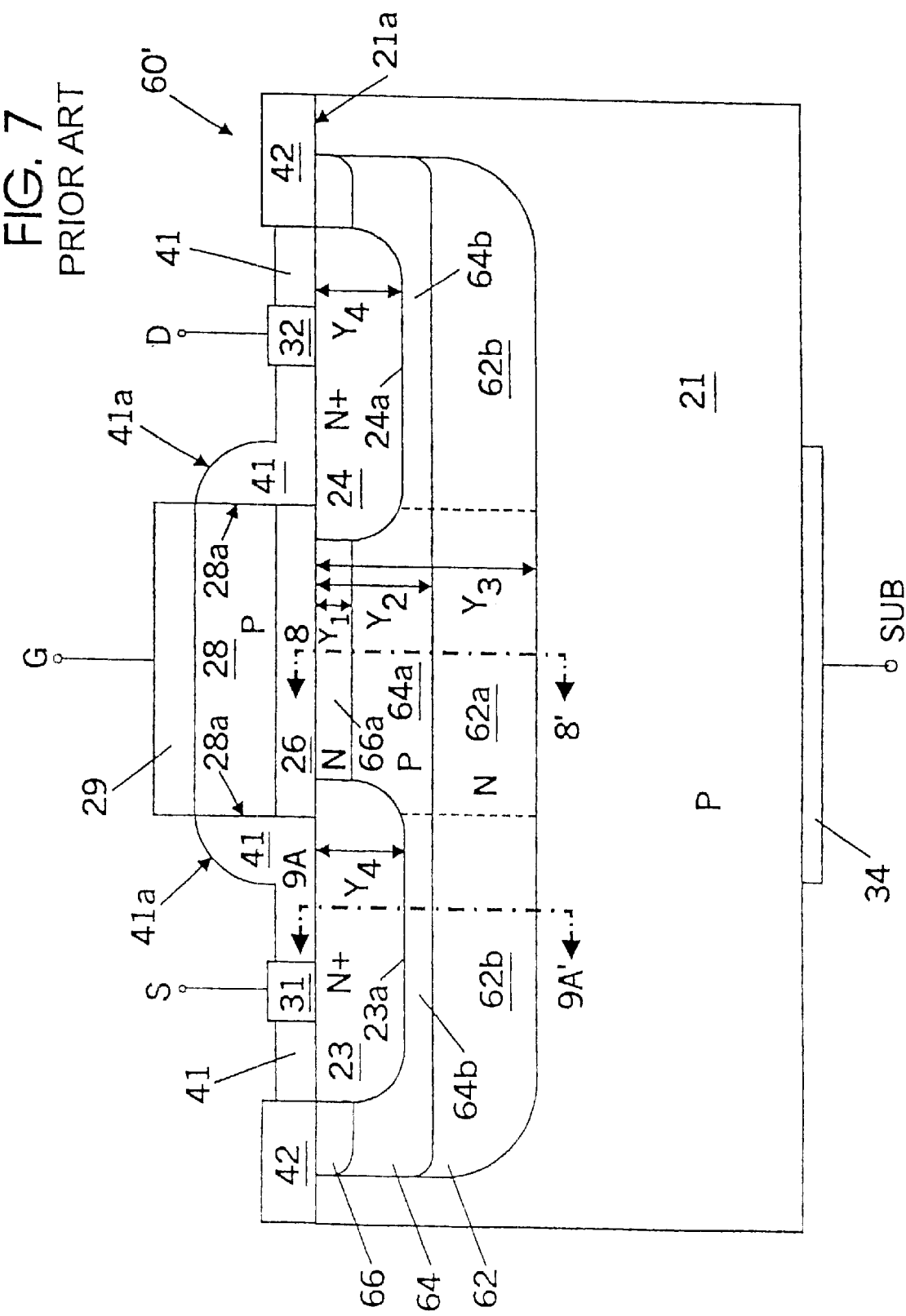
FIG. 7 illustrates a cross-sectional view of a second embodiment of a Vinal-FET according to U.S. Pat. No. 5,698,884.

FIGS. 6 and 7 illustrate first and second embodiments of a Vinal-FET respectively. As shown in FIG. 6, Vinal-FET 60 includes a semiconductor substrate 21 of first conductivity type, here P-type. It will be understood by those having skill in the art that semiconductor substrate 21 may also include one or more epitaxial layers formed on a bulk semiconductor material so that the substrate surface 21a may actually be the outer surface of an epitaxial layer rather than the outer surface of bulk semiconductor material.

Still referring to FIG. 6, a first tub region 62 of second conductivity type (here N-type) is formed on the substrate 21 at surface 21a and extending into the substrate a first depth $Y_3$ from the substrate surface 21a. A second tub region 64 of the first conductivity type, here P-type, is included in the first tub region 62. Second tub region 64 extends into the substrate a second depth $Y_2$ from substrate surface 21a, with the second depth $Y_2$ being less than a first depth $Y_3$. The second tub region 64 in the first tub region 62 may also extend laterally beyond first tub region 62. Second tub region 64 forms a Drain Field Terminating (DFT) region as will be described below. A third tub region 66 of the second conductivity type, here N-type, is included in the second tub region 64. The third tub 66 extends into the substrate 21 a third depth $Y_1$ from the substrate surface wherein the third depth $Y_1$ is less than the second depth. Third tub 66 is preferably formed in an epitaxial layer as will be described below.

Still referring to FIG. 6, spaced apart source and drain regions 23 and 24 respectively, of the second conductivity type (here N+), are formed in the first tub region 62 and extend into the substrate a fourth depth $Y_4$ from the substrate surface 21a. As shown in FIG. 6, the fourth depth $Y_4$ is greater than the third depth $Y_1$. As shown in FIG. 6, fourth depth $Y_4$ is also greater than the second depth $Y_2$, but is less than the first depth $Y_3$. Accordingly, the source and drain diffusions 23 and 24 respectively, extend through the third and second tubs 66 and 64 respectively, and into the first tub 62. In a second embodiment of a Vinal-FET 60' as shown in FIG. 7, the fourth depth $Y_4$ is greater than the third depth $Y_1$ but is less than the second depth $Y_2$, so that the source and drain regions extend through the third tub 66 and into the second tub 64, but do not extend into the first tub 62.

Vinal-FET transistors 60 and 60' of FIGS. 6 and 7 respectively, also include a gate insulating layer 26 and a gate electrode including polycrystalline silicon layer 28 of the first conductivity type, here P-type. Source, gate and drain contacts 31, 29 and 32 are also included as already described. A substrate contact 34 is also included. The substrate contact is shown opposite surface 21a but it may also be formed adjacent surface 21a as in previous embodiments.

The Vinal-FETs 60 and 60' of FIGS. 6 and 7 may also be described from the perspective of the layers in the substrate 21 which extend between the source and drain regions 24. When viewed in this regard, third tub 66 produces a first layer 66a of a second conductivity type in the substrate at the substrate surface which extends from the source region 23 to the drain region 24 and also extends into the substrate a first depth $Y_1$ from the substrate surface. Second tub 64 produces a second layer 64a of the first conductivity type in the substrate which extends from the source region 23 to the drain region 24 and extends into the substrate from the first depth $Y_1$ to a second depth $Y_2$ from the substrate surface. Second layer 64a acts as Drain Field Terminating means as described below. First tub 62 produces a third layer 62a of the second conductivity type in the substrate which extends from the source region to the drain region and extends into the substrate from the second depth $Y_2$ to a third depth $Y_3$ from the substrate surface.

When viewed in this manner, in the embodiment of FIG. 6, the third layer 62a also extends from the source bottom 23a to the drain bottom 24a as indicated by regions 62b. In the embodiment of FIG. 7, the second and third layers 64a and 62a respectively, both extend from the source bottom 23a to the drain bottom 24a as shown at regions 64b and 62b respectively.

The Vinal-FET of FIGS. 6 and 7 may also be regarded as a Tub-FET which includes a contra-doped buried tub 64 within the original tub. Still alternatively, the Vinal-FET may be viewed as a Tub-FET which includes a buried layer of first conductivity type 64a beneath the channel region 66a. As will be described in detail below, second tub 64 including second layer 64a acts as Drain Field Terminating (DFT) means to shield the source region by preventing the applied drain bias from causing carriers to be injected from the source region into or below the channel region. Accordingly, second tub 64 and second layer 64a may also be referred to as a Drain Field Termination (DFT) region.

Operation of the Vinal-FET transistors 60 and 60' of FIGS. 6 and 7 are described in detail in U.S. Pat. No. 5,698,884 and will not be described again herein.

Metal Gate Fermi-FET Transistors

According to published PCT Application No. WO 99/17371, the threshold voltage of Fermi-FET transistors may be decreased without unduly increasing leakage current and/or unduly reducing saturation current, by using a metal gate in a Fermi-FET rather than a contra-doped polygate.

Figure 8:
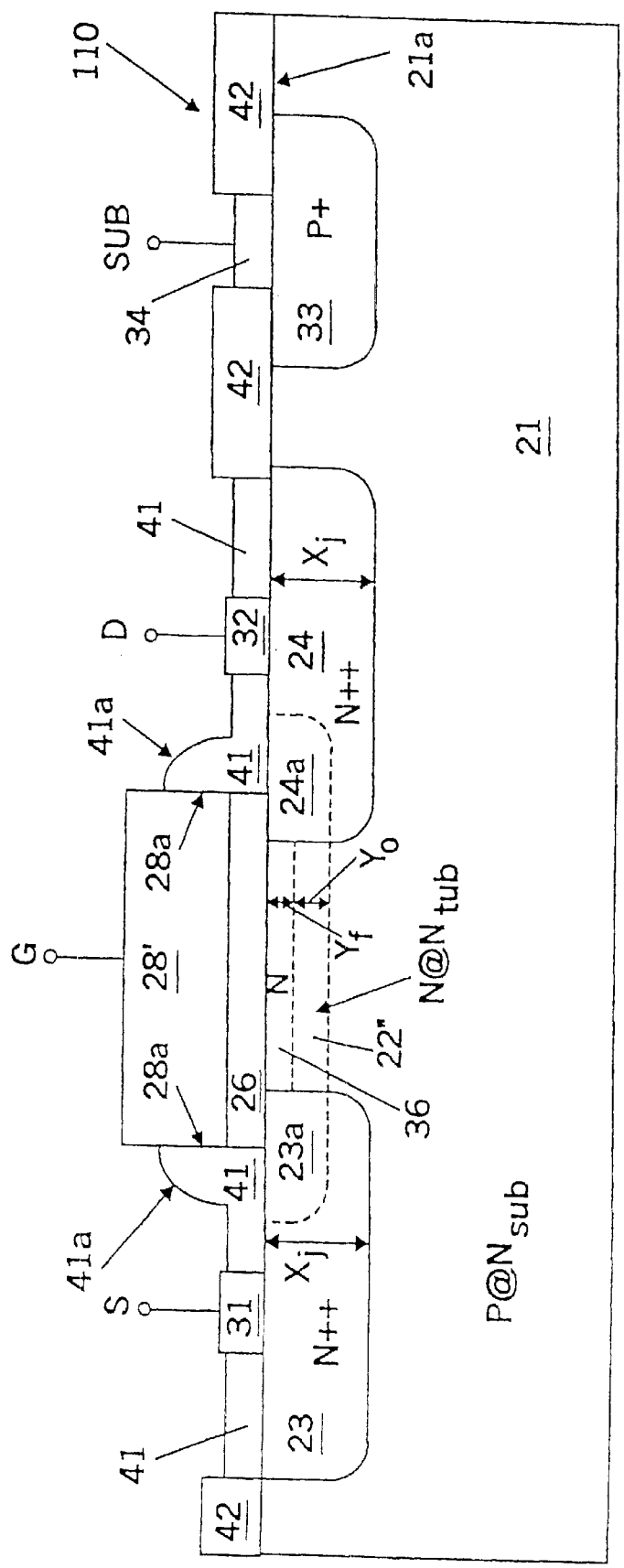
FIG. 8 illustrates a cross-sectional view of an embodiment of a metal gate Fermi-FET according to published PCT Application WO 99/17371.

FIG. 8 illustrates an embodiment of a metal gate Fermi-FET. This embodiment is patterned after the N-channel, short-channel Fermi-FET of U.S. Pat. No. 5,543,654 that is illustrated in FIG. 4 of the present application. However, it will be recognized by those having skill in the art that metal gate Fermi-FET technology can be applied to all Fermi-FETs to lower the threshold voltage thereof.

As shown in FIG. 8, metal gate Fermi-FET 110 includes a metal gate 28' rather than the P-type polysilicon gate 28 and metal gate electrode layer 29 of FIG. 4. For ease of illustration, all other elements of transistor 110 are unchanged from that of FIG. 4. Accordingly, as shown in FIG. 11, a metal gate 28' is included directly on the gate insulating layer 26. Stated differently, the metal gate 28' of the Fermi-FET 110 is free of doped polysilicon directly on the gate insulating layer 26. Thus, the contact potential is not controlled by the Fermi-potential of polysilicon. It will be understood that the metal gate may include multiple layers, wherein the layer that is directly on the gate insulating layer is free of doped polysilicon.

Specifically, metals, silicides, or other metal alloys with work functions near the center of the silicon band gap can significantly reduce the Fermi-FET threshold without unduly increasing detrimental two-dimensional effects.

Materials with a work function near 4.85V are particularly preferred in Fermi-FET structures because they can result in symmetrical N-Channel and P-Channel dopings. Other materials may be used to give a lower relative threshold to either the N- or P-channel devices depending upon a desired performance. Preferably, metals or metal alloys having work function between that of P-type silicon and N-type silicon are used.

Trench Gate Fermi-FET Transistors

Figure 9:
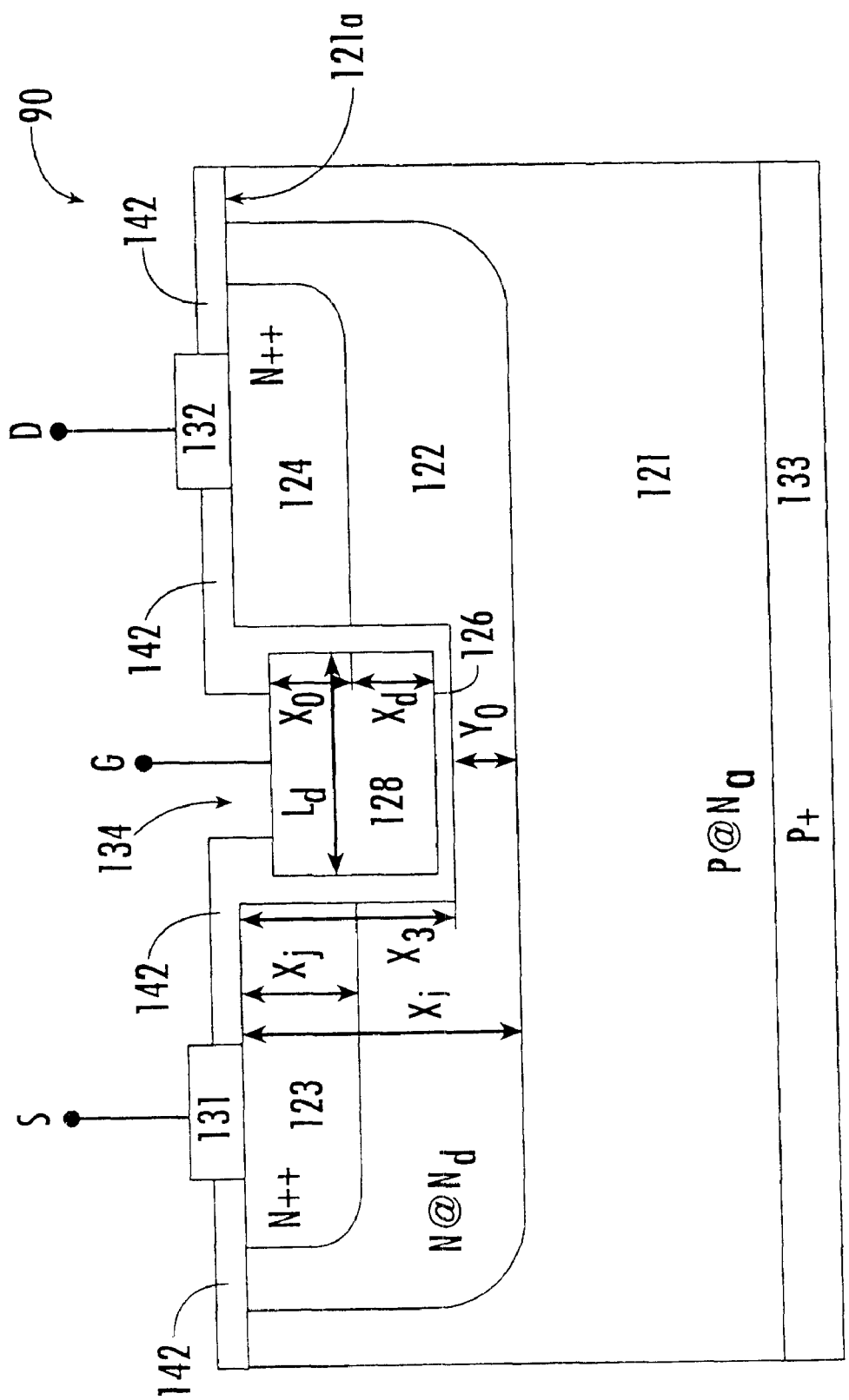
FIG. 9 illustrates a cross-sectional view of trench gate Fermi-FETs according to embodiments of the present invention.

Referring now to FIG. 9, a cross-sectional view of N-channel trench gate Fermi-FETs 90 according to embodiments of the present invention is illustrated. It will be understood by those having a skill in the art that a P-channel trench gate Fermi-FET may be obtained by reversing the conductivities of the N and P regions. As shown in FIG. 9, these embodiments include a semiconductor substrate 121 of first conductivity type, here P-type, and having a surface 121a. It will be understood that the substrate 121 actually may be a well region of first conductivity type in a substrate 133 of second conductivity type, here N-type. In particular, N-channel trench gate Fermi-FETs typically may be formed in a P-well 121 in an N-type substrate 133, whereas P-channel trench gate Fermi-FETs may be formed in an N-type substrate without the need for a well region. It also will be understood that both N-type and P-type trench gate Fermi-FETs may be integrated into a single semiconductor substrate, often referred to as a CMOS substrate. Finally, it will be understood by those having skill in the art that the substrate 133 and/or well region 121 may also include one or more epitaxial layers formed on a bulk semiconductor material, so that the substrate surface 121a may actually be the outer surface of an epitaxial layer rather than the outer surface of bulk semiconductor material.

Still referring to FIG. 9, a tub region, also referred to as a Fermi-tub, 122 of second conductivity type, here N-type, also is provided in the semiconductor substrate 121 at the surface 121a and extending into the semiconductor substrate a first depth $X_i$ from the surface 121a. Spaced apart source and drain regions 123 and 124, respectively, of the second conductivity type, here N-type, also are provided in the tub region 122 at the surface 121. As shown in FIG. 9, the source and drain regions 123 and 124 define single conductivity junctions or unijunctions of the second conductivity type, here N-type, with the tub region 122. The spaced apart source and drain regions are highly doped, shown as $N^{++}$and extend into the tub region 122 a second depth $X_j$ that is less than the first depth $X_i$.

A trench 134 is provided in the tub region 122, between the spaced apart source and drain regions 123 and 124, and extending from the surface 121a into the tub region 122 a third depth $X_3$ that is more than the second depth $X_j$ but less than the first depth $X_i$. Although the trench 134 is illustrated in FIG. 9 as being rectangular in cross-section, many other cross-sectional shapes may be used, such as U, V or rounded comer, rectangular shaped cross-sections. An insulated gate electrode, comprising a gate electrode 128 and a gate insulating layer 126 is provided in the trench 134. The gate electrode 128 has a width $L_d$ and extends beneath the source/drain regions 123/124 by an amount $X_d$ and extends above the source and drain regions by an amount $X_0$.

Source and drain electrodes 131 and 132 are provided, for example on the surface 121a, that electrically contact the source and drain regions 123 and 124, respectively. Insulating regions 142 may be provided to separate the source and drain electrodes 131 and 132. A substrate contact also may be provided on the surface 121a and/or on the opposite surface of the substrate. Finally, as shown in FIG. 9, the substrate (or well) 121 is doped at a doping density $N_a$ and the tub 122 is doped at a doping density $N_d$.

Still referring to FIG. 9, according to embodiments of the present invention, the distance $Y_0$ between the tub and the trench floor, which is equal to the first depth $X_i$ minus the third depth $X_3$, is set according to Equation (5) as follows:

$$Y_o = \sqrt{\frac{2\varepsilon_s kT}{q}\left(\frac{N_a}{N_d N_a + N_d^2}\right)\ln\left(\frac{N_d N_a}{n_i^2}\right)}, \quad (5)$$

where $N_d$ is the doping density of the tub 122, and where this doping density varies, preferably is the average doping density of the tub 122 between the trench floor and the substrate 121; $N_a$ is the substrate or well doping, and where $N_a$ varies, preferably is the doping density beneath the gate 128 and adjacent the tub 122; $n_i$ is the intrinsic carrier concentration of the material at a temperature T degrees Kelvin; $\varepsilon_s$ is the permittivity of the material (for silicon, k is $1.38\times10^{-23}$ Joules/°Kelvin); and q is $1.6\times10^{-19}$ coulombs.

Equation (5) can define the length of a depletion region in the tub 122 beneath the trench 134. Preferably, this depletion region extends to fully deplete the tub region 122 beneath the trench 134 from the third depth $X_3$ to the first depth $X_j$.

In embodiments of the invention, with $Y_0$ exactly equal to the distance defined in Equation (5), the threshold voltage of the trench gate Fermi-FET will be equal to the difference in work function between the silicon substrate and the gate material. Stated differently, the transistor threshold will be twice the Fermi potential of the substrate. This can result in a device with the lowest possible vertical field in the channel region, which can be zero at the threshold voltage of the device. Thus, zero static electric field may be produced perpendicular to the surface of the substrate at the third depth $X_3$, upon application of the threshold voltage of the field effect transistor to the insulated gate electrode. Correct selection of the proper gate material can result in threshold values from a few millivolts or less to over one volt or more, while still satisfying the criteria of Equation (5), which can produce an "ideal" trench gate Fermi-FET transistor.

Adjustment of the transistor threshold, either above or below the "ideal" value, is possible, with only small increases in the vertical field. Thus, the vertical field may be maintained at least an order of magnitude less than that produced by a field effect transistor that does not include the tub region 122. In other embodiments, the electric field may be less than half that produced by a field effect transistor that does not include the tub region 122. In still other embodiments, the vertical electric field may be less than one fifth that produced by a field effect transistor that does not include the tub region 122. In yet other embodiments, the static electric field may be less than 700V/cm, which may be compared to conventional field effect transistors that have vertical fields of between about 10,000V/cm and about 100,000V/cm. Increases in the vertical field may be produced by varying the actual value of $Y_0$ from that defined in Equation (5). Increasing $Y_0$ can lower the device threshold towards zero.

Conventional surface channel transistors and conventional buried channel field effect transistors generally have a strong threshold sensitivity to the gate insulator thickness. In sharp contrast, in embodiments of Fermi-FET transistors, there can be little or no sensitivity to gate insulator thickness, so that the threshold voltage can remain independent of the thickness of the insulating layer 126 on the trench floor. This can be due to the fact that, at the threshold voltage, the insulator field switches from the negative to the positive direction, passing through zero at very close to the threshold voltage.

Figure 10A:
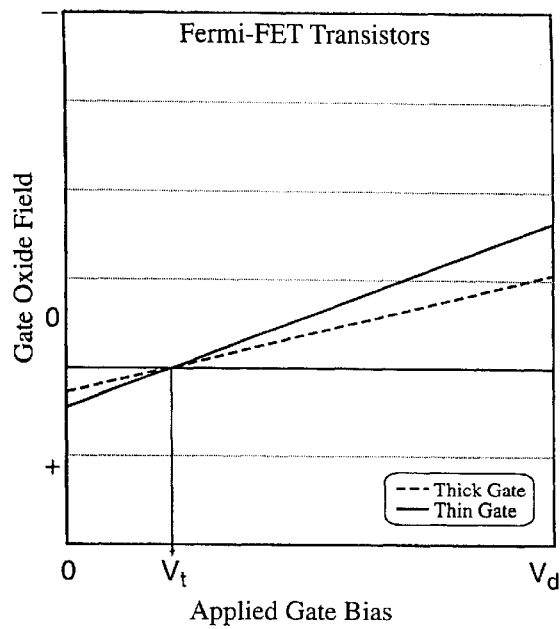
FIGS. 10A and 10B graphically illustrate applied gate bias vs. gate insulator field for trench gate Fermi-FET transistors according to embodiments of the invention and conventional surface channel transistors, respectively.
Figure 10B:
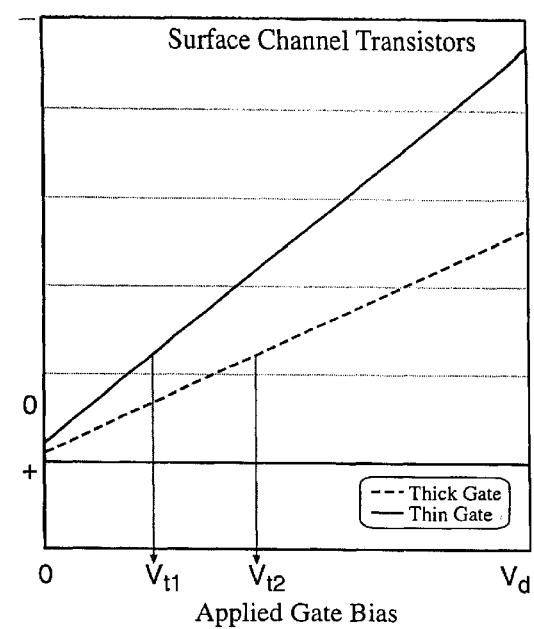

FIGS. 10A and 10B graphically illustrate applied gate bias vs. gate insulator (for example, oxide) field for trench gate Fermi-FET transistors and conventional surface channel transistors, respectively. In FIGS. 10A and 10B, and in all simulation results that follow, the simulations have been performed on transistors with the following characteristics:

Drawn Channel Length, $L_d$=0.18 μm;
Gate Oxide (Insulator) Thickness, $T_{ox}$=35 Å;
Operating Drain Voltage, $V_d$=2.5 Volt; and
Leakage Current @1.8 V, $I_{dss}$=20 pA/μm.

As shown in FIG. 10A, the trench gate Fermi-FET can have a lower field and a single threshold, regardless of the gate insulator thickness. In contrast, a conventional surface channel transistor can have a higher field and a threshold that is highly dependent on the thickness of the gate oxide, as shown in FIG. 10B.

Moreover, conventional trench gate field effect transistors, such as described, for example in U.S. Pat. Nos. 4,835,585 to Panousis; 5,108,938 to Solomon; and 5,142,640 to Iwamatsu also may suffer due to a strong dependence of the threshold voltage on the gate insulator thickness. Stated differently, in non-Fermi-FET devices, a trench may provide non-uniform channel formation because the threshold voltage may be higher at the regions of thicker dielectric, such as at the corners or vertices of the trench. In sharp contrast, trench gate Fermi-FETs according to embodiments of the invention can provide uniform threshold across the entire device, regardless of the gate insulator thickening at the vertices.

Figure 11A:
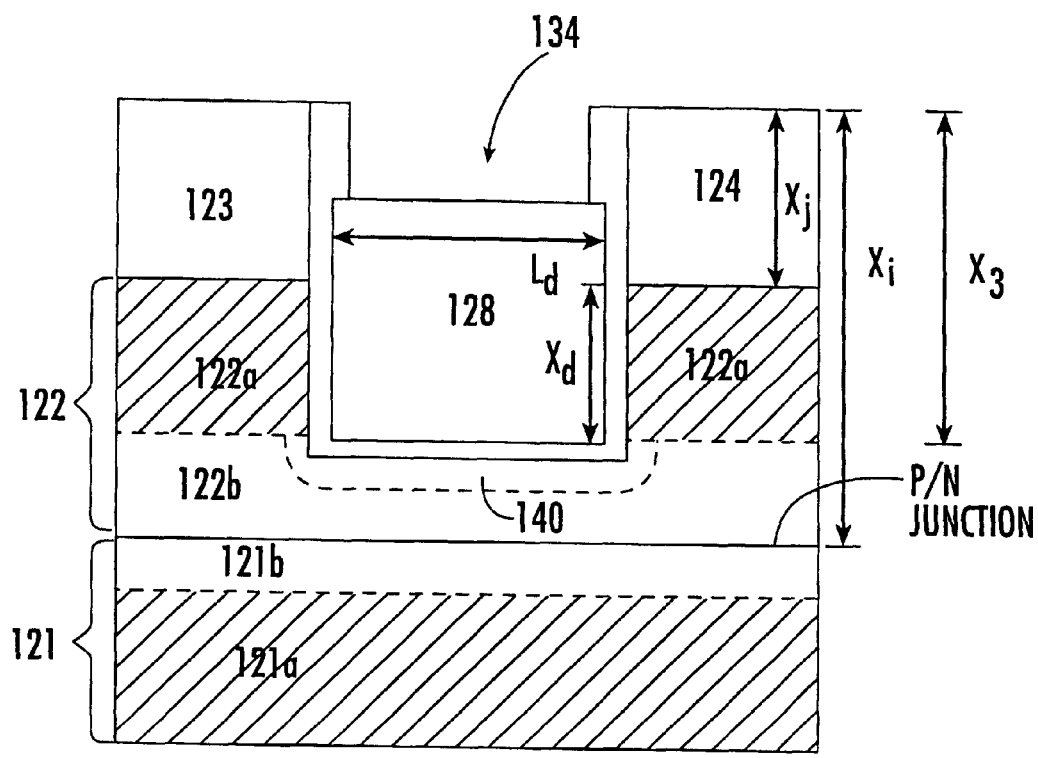
FIGS. 11A and 11B are cross-sectional views of trench gate Fermi-FET transistors according to embodiments of the invention and conventional FETs, respectively, illustrating and contrasting channel formation therein.
Figure 11B:
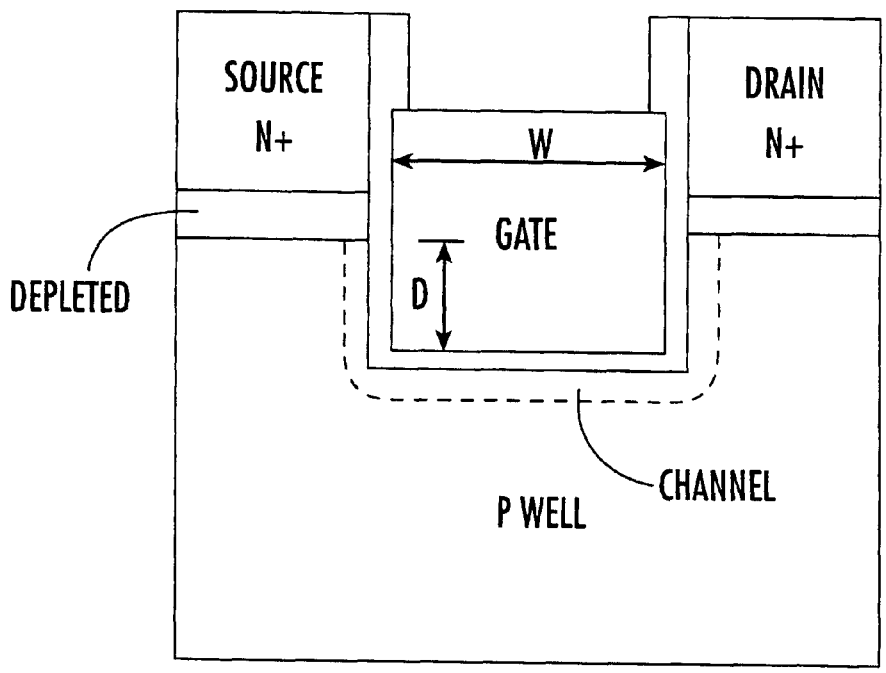

As shown in FIGS. 10A and 10B, trench gate Fermi-FETs according to embodiments of the present invention can have very low sensitivity of threshold voltage to gate dielectric thickness. This can allow the entire channel to turn on as a unit, which can provide a high $G_m$ and very rapid turn-on. In sharp contrast, surface channel devices and conventional buried channel transistors may have a significantly higher threshold sensitivity to oxide thickness. The thicker dielectric that occurs adjacent the vertices of the trench, whether the trench is rectangular, rounded rectangle, V-shaped or U-shaped, can cause the transistor to turn on first in the thin areas and then later in the thicker areas, thus increasing the on-resistance and decreasing the subthreshold swing and $G_m$. FIGS. 11A and 11B are cross-sectional views of embodiments of trench gate Fermi-FET transistors and conventional trench gate MOSFET transistors, respectively, illustrating and contrasting channel formation therein. In FIGS. 11A and 11B, all the source, drain and gate electrodes are at 0V, so that the devices are off. As shown in FIG. 11A, the P/N junction that is formed between the tub 122 and the well (or substrate) 121 causes depletion to take place within both the tub 122 and the well 121. Thus, a depleted region 122b and an undepleted region 122a is created in the tub 122, and a depleted region 121b and an undepleted region 121a is created in the substrate or well 121.

As shown in FIG. 11A, the tub region 122 is fully depleted beneath the trench 134 from the trench floor to the P/N junction between the tub 122 and the well 121 at the interface of the depleted regions 122b and 121b. This creates a channel 140 that is confined to beneath the trench 134, extends across the trench width $L_d$ and has uniform thickness beneath the trench and across the trench width $L_d$. Thus, carriers of the second conductivity type flow in the tub region 122 beneath the trench 134 at the third depth $X_3$ upon application of the threshold voltage of the field effect transistor to the gate electrode 128. Moreover, carriers of the second conductivity type flow in the tub region 122 beneath the trench 134, and extend from the third depth $X_3$ towards the first depth $X_i$ upon application of voltage to the gate electrode 128 beyond the threshold voltage of the field effect transistor. Also, the length of the channel 140 is proportional to the trench width $L_d$ and is independent of the difference between the first depth $X_i$ and the second depth $X_j$.

In sharp contrast, in FIG. 11B, in a conventional trench MOSFET, the channel length generally is a strong function of the depth of the trench according to the following equation: $L_{eff} \approx W+2D$, where $L_{eff}$ is the effective channel length, W is the width of the trench, and D is the depth that the trench exceeds the source and drain depths. Thus, small changes in the depth of the trench can cause relatively large changes to the effective channel length in a conventional MOSFET, but may only cause slight variations in threshold voltage of a trench gate Fermi-FET. This can provide much greater process stability than would be otherwise obtainable.

As was described above, N-channel and P-channel trench gate Fermi-FETs may be integrated into an integrated circuit substrate to provide high performance CMOS applications for logic memory, microprocessor and/or other applications. Moreover, trench gate Fermi-FETs also may be well suited for lateral power devices, including power amplifiers, which can be particularly well suited for high frequency, high power operation. In these lateral transistors, the width and doping level of the undepleted portion 122a of the tub 122 under the drain region 124 can be "tuned" to serve as a vertical drift region with graded concentration along the current path. Thus, an abrupt single conductivity junction need not be provided between the source 123 and the tub 122 and between the drain 124 and tub 122. The drift region, combined with the greater effective mobility of the Fermi-FET channel can combine to create an RF power amplifier with high breakdown voltage, low on-resistance and an operating frequency usually associated with more exotic semiconductors, such as gallium arsenide.

Trench Gate Fermi-FET Fabrication Processes

Fabrication processes for forming trench gate Fermi-FET transistors now will be described. As will be shown below, fabrication processes for creating a trench gate Fermi-FET can be significantly shorter and/or simpler than those used to form traditional MOSFETs and/or Fermi-FETs. One reason that the process can be shorter and/or simpler is because the gate structure can be created after other doping has been performed. This can allow the gate, source, drain and channel to be self-aligned.

FIGS. 12A–12F are cross-sectional views of trench gate Fermi-FETs according to embodiments of the present invention during intermediate fabrication steps according to embodiments of the present invention. Fabrication of an N-channel trench gate Fermi-FET is shown. However, P-channel trench gate Fermi-FETs also may be formed by reversing the conductivity types.

Figure 12A:
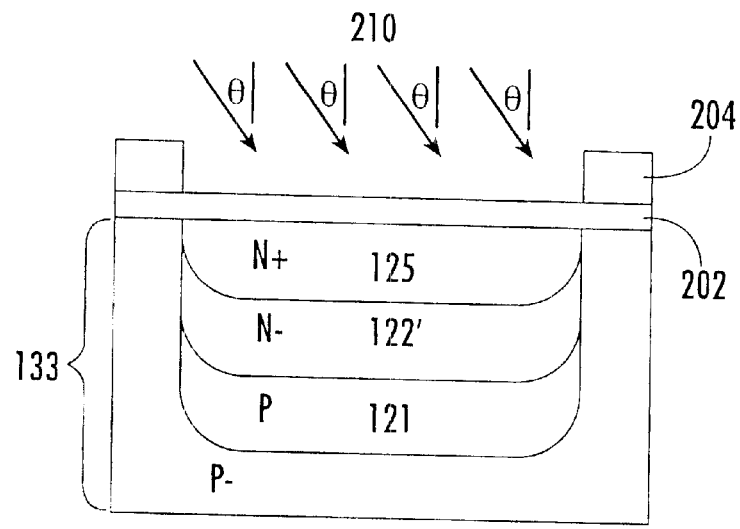
FIGS. 12A–12F are cross-sectional views of trench gate Fermi-FETs according to embodiments of the invention, during intermediate fabrication steps according to embodiments of the present invention.

Referring now to FIG. 12A, a P-type substrate 133, such as a monocrystalline silicon substrate or a silicon-on-insulator substrate is provided. An initial oxide layer 202 or other insulating layer may be formed using conventional techniques. A mask 204 such as a photoresist layer may be patterned to define the location of the transistor. Conventional field oxide and/or trench isolation also may be provided. The mask 204 defines an implant window through which various ions 210 may be implanted, as will be described below.

Still referring to FIG. 12A, P ions are implanted to form P-well 121. N ions are implanted to form N-tub 122' and N+ ions are implanted to form a source/drain region 125. It will be understood that the order of implantation to form regions 121, 122' and 125 may be arbitrary, so that, for example, the source/drain region 125 may be implanted prior to the tub region 122' and either or both of these regions may be implanted prior to forming the well region 121. It also will be understood that when a P-type substrate is used and a N-channel trench gate Fermi-FET is fabricated, the well region 121 need not be formed. Implementation techniques are well known to those having skill in the art, and need not be described further herein. As also shown in FIG. 12A, implantation of the source/drain region 125 may take place at a tilt angle θ from vertical, as will be described in detail below.

Figure 12B:
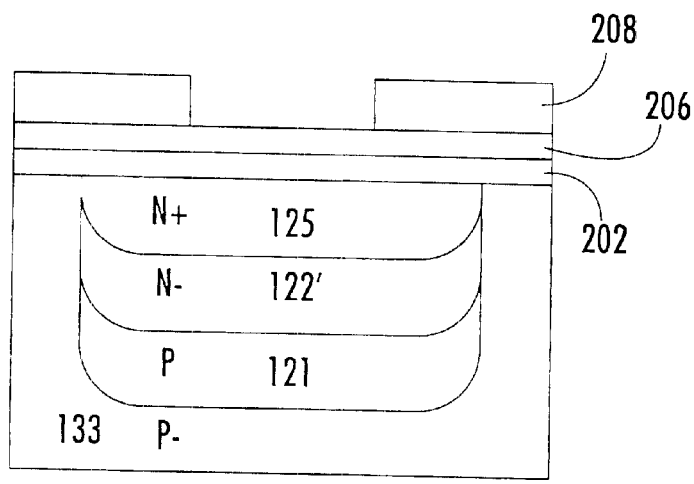
Figure 12C:
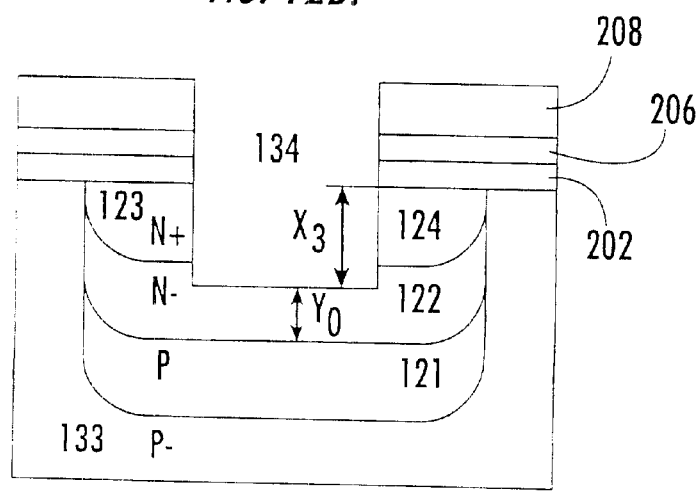

Referring now to FIG. 12B, the mask 204 may be removed and an optional silicon nitride layer 206 may be formed using conventional techniques. A second patterned mask 208 such as a second photoresist layer then may be formed to define the trench. Then, as shown in FIG. 12C, the mask 208 is used to etch the nitride layer 206 which then can be used as a mask to define the trench 134. The trench 134 is etched through the source/drain region 125 to define spaced apart source and drain regions 123 and 124, and is etched partially into the tub region 122 to define the depth $Y_0$ that was described above.

Thus, the trench and gate are formed after performing the implants for the source/drain, tub and well. Accordingly, since the implants 210 can be completed before the gate structure is created, a high dose N+ implant can be performed to form the source/drain region 125, using a large tilt angle θ, such as a tilt angle θ that is greater than about 15°. Thus, shallow and sharp source/drain regions 123 and 124 may be defined, compared to processes that fabricate a gate electrode and then use the gate electrode to form self-aligned source and drain regions thereafter. In conventional processes, a large tilt angle θ that is desirable to provide shallow and sharp source/drain regions, may cause misalignment between the source and drain regions and the gate. In sharp contrast, a large tilt angle θ may be used in FIG. 12A, such as a tilt angle of 15° or greater from the vertical, to form the source/drain region 125, because the trench 134 and gate are formed subsequent to forming the source/drain regions. A small or no tilt angle may be used to form the tub region 122' and/or the well 121.

It also will be understood that the trench depth X3 should be matched to the implant profiles of the source 123, drain 124 and tub 122 to allow optimized Fermi-FET performance according to Equation (5). Since the actual implant profile may be somewhat difficult to predict theoretically, the trench depth $X_3$ can be matched to the actual implant profiles by creating test wafers containing the implants and thermal steps and then etching by known amounts into the surface of the wafer. These samples then can be measured using capacitance-voltage (CV) techniques and interpreted as will be described below.

Figure 12D:
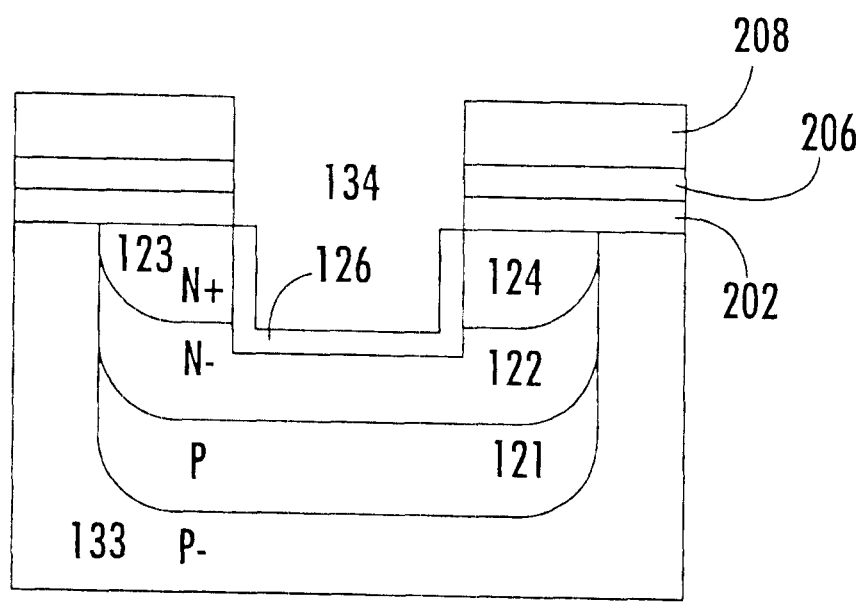

Referring now to FIG. 12D, the gate insulating layer 126 is formed. The gate insulating layer 126 may be formed using conventional thermal oxidation techniques and/or conventional chemical-vapor deposition techniques, to form a layer of silicon dioxide. Multi-layer oxide materials also may be used. Other gate insulating layers also may be used, such as silicon nitride. Moreover, because the high temperature anneals already have occurred in connection with FIGS. 12A–12C, exotic dielectric materials, such as high dielectric constant materials including but not limited to ferroelectric materials, such as PZT, may be used. As is well known to those having skill in the art, the properties of these materials may be highly sensitive to high temperature. Since the high temperature anneals already have occurred, they may be used in trench gate Fermi-FET transistors.

Figure 12E:
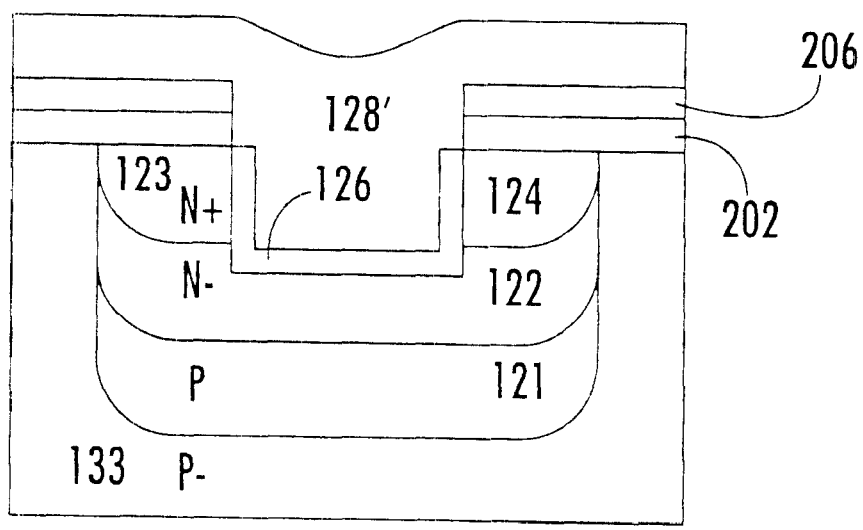
Figure 12F:
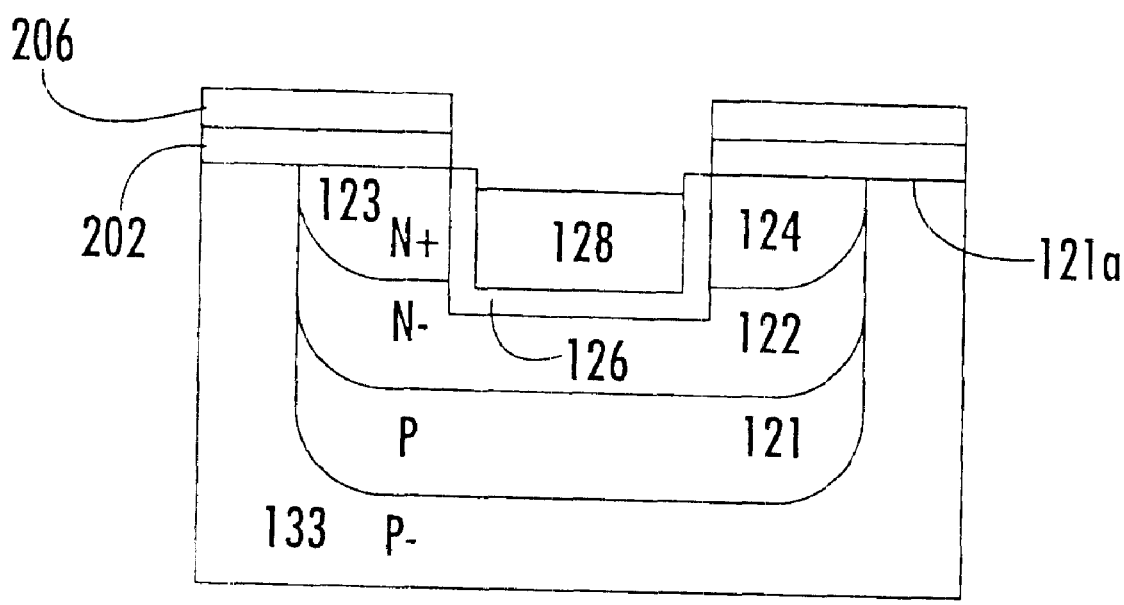

Referring now to FIG. 12E, a gate electrode material 128' may be blanket-deposited and then etched back or otherwise planarized, to define the gate electrode 128 of FIG. 12F. In some embodiments, tungsten may be used for the gate electrode and may be deposited using conventional deposition techniques, and then planarized using chemical-mechanical polishing (CMP), for example using the nitride layer 206 as a stop.

As also shown in FIG. 12F, the gate electrode 128 may be overetched, and/or a separate etching step may be performed, to recess the gate electrode 128 beneath the surface 121a of the substrate 133. As will be described below, the gate electrode 128 preferably is recessed beneath the surface by an amount that minimizes capacitance between the insulated gate electrode and the spaced apart source and drain regions 123 and 124, without reducing drain current in the field effect transistor. Finally, the nitride and/or oxide layers 206 and 202 may be stripped and the insulating layer 142 and source and drain contacts 131 and 132 (FIG. 9) may be defined using conventional techniques. Moreover, a top side and/or bottom side substrate contact also may be incorporated into this process using conventional techniques. Device isolation also may be incorporated prior to or after the processing that was described above.

Accordingly, high temperature steps may be reduced and preferably eliminated after the activation anneal that follows the implants of FIG. 12A. Thus, many alternative gate dielectric materials that may not be readily used with conventional transistors may be used.

Electrical Simulation

A structure file from the process simulation that was described above was used as an input for an Atlas simulation program, to simulate an N-channel transistor. The simulations use the default mobility parameters and assign a work function value of 4.63 eV to the gate material. Tungsten was used in this example. All other electrodes were defined as neutral.

Figure 13:
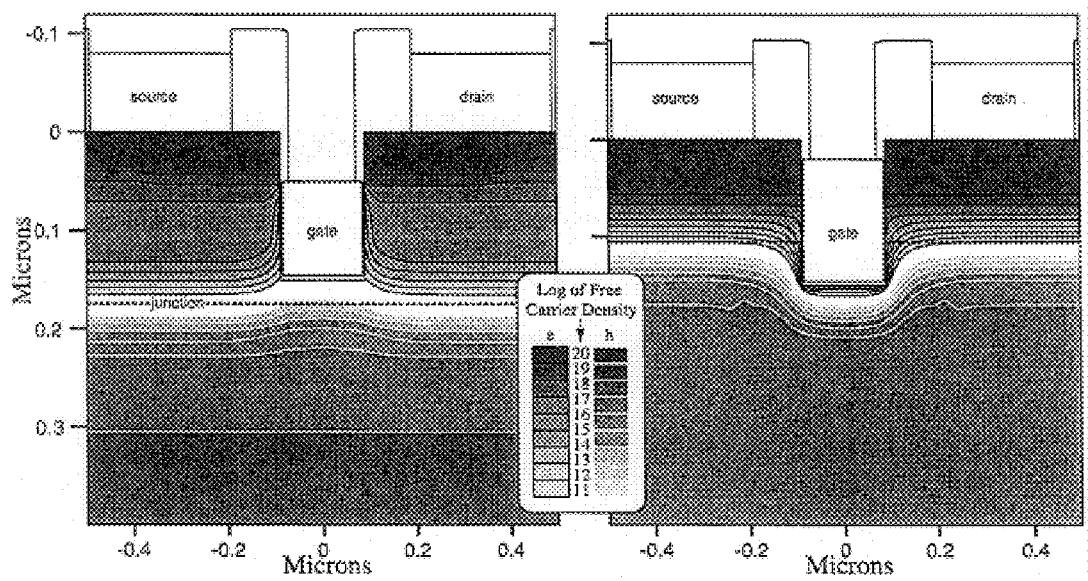
FIG. 13 illustrates simulation results showing free carrier concentrations present in embodiments of trench gate Fermi-FETs according to embodiments of the invention and conventional FETs.

FIG. 13 illustrates simulation results showing the free carrier concentrations present in an embodiment of a trench gate Fermi-FET (left side) and a conventional trench MOSFET (right side) created with the same architecture and with all electrodes at zero bias. The difference in the channel length is clearly visible by comparing the two devices. It will be understood that for the electrical simulation comparison, the conventional MOSFET does not contain a drift region that is included in the Fermi-FET. However, this may serve to increase the apparent drive current for the MOSFET side.

FIGS. 14A and 14B graphically illustrate drain current vs. gate voltage characteristics of the simulated trench gate Fermi-FET vs. the simulated MOSFET using identical model parameters in logarithmic and linear forms, respectively. FIGS. 14A and 14B clearly show a potential benefit of using the trench gate Fermi-FET architecture. Even with the drift regions present in the Fermi-FET, the MOSFET has only about 65% of the drive current, with about thirty times greater leakage when the threshold voltages are matched.

Moreover, the trench can dramatically improve the short channel effects that often are seen in buried channel types of devices. This can allow a lower threshold voltage to be used, combined with significantly lowered capacitance, to thereby allow, for example, high performance radio frequency devices to be produced.

FIGS. 15A and 15B illustrate transistor characteristics for the simulated embodiment of the trench gate Fermi-FET in logarithmic and linear form, where drain voltage is varied between 0.1V and 2.5V. The relative absence of short channel effects clearly is shown.

FIGS. 16A and 16B graphically illustrate simulation results for a trench gate Fermi-FET transistor as a function of a change of the gate insulator thickness. In particular, FIGS. 15A and 15B illustrate a 4.0 nm thick gate insulator thickness whereas FIG. 16A and 16B illustrate a 5.0 nm gate insulator thickness. The independence of threshold on gate insulator thickness is clearly shown. No doping or depth changes occur between the structures of FIGS. 15A and 15B and FIGS. 16A and 16B. The thicker dielectric can allow higher operating voltages without the need for line width or doping changes. Again, the absence of short channel effects can be seen.

Both a 2.5V and a 3.3V trench gate Fermi-FET can have very high breakdown voltage ($BV_{dss}$) due to the transistor architecture. With a suitable gate dielectric, the $BV_{dss}$ can be a function of the P/N junction rather than the transistor architecture. Thus, proper construction of the P/N junction can permit very high breakdown performance, while allowing a low threshold voltage to be maintained. This can also make the trench gate Fermi-FET a desirable technology for power applications.

Figure 17A:
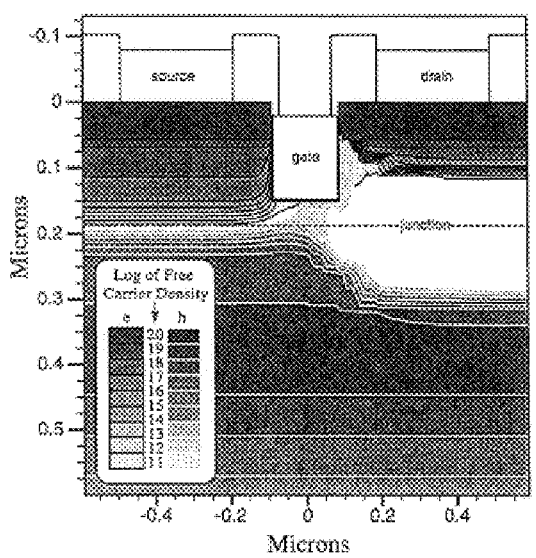
FIG. 17A is a simulation of short channel trench gate Fermi-FET transistors according to embodiments of the invention with a drain bias at the point of breakdown.
Figure 17B:
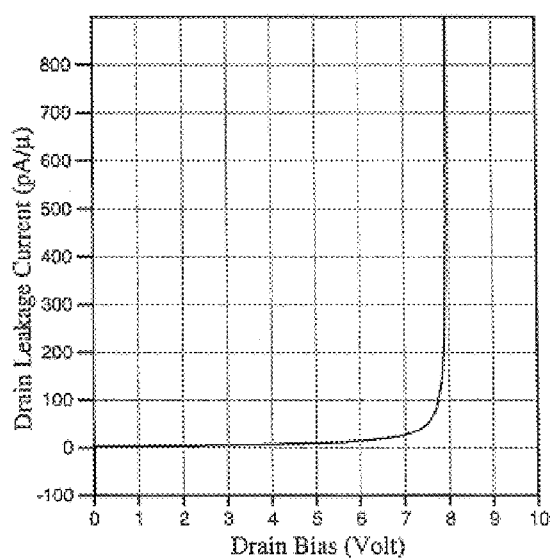
FIG. 17B illustrates drain leakage current vs. drain bias voltage characteristics for simulated transistors of FIG. 17A.
Figures 18A, 18B, 18C, 18D, 18E:
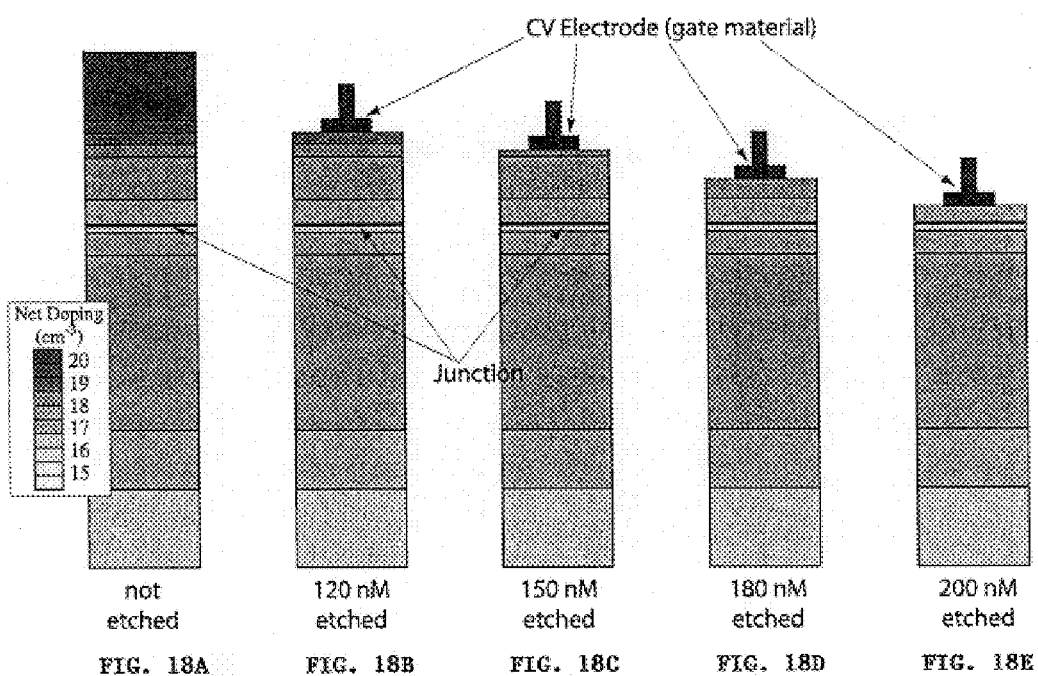
FIGS. 18A–18E are cross-sectional views of various stages of etching that may take place in a single wafer and/or in a series of wafers in order to empirically determine a value of a trench depth according to embodiments of the present invention.

FIG. 17A a simulated short channel trench gate Fermi-FET transistor with the drain bias at the point of breakdown. The contours represent the free holes and electrons, and illustrates the free carrier concentrations (above $10^{11}$ cm$^{-3}$) at the onset of breakdown for the 2.5V transistor of FIGS. 15A and 15B. The breakdown path from the drain to the substrate is clearly shown. The breakdown occurs at a drain electrode potential of 7.98V, as shown in FIG. 17B. Terminal currents at breakdown show only drain to well action, but the region of maximum field is immediately below the gate trench due to the proximity of the undepleted well.

The breakdown voltage of trench gate Fermi-FET transistors according to embodiments of the present invention may be increased and preferably maximized using at least two techniques. First, the source and drain regions 123 and 124 (FIG. 9) can be made shallow enough to allow a region of low concentration N silicon to exist above the junction between the tub 122 and well 121. This can be accomplished with low energy diffusion implants at a high tilt angle θ for the source/drain region 125 (FIG. 12A) if desired. A high tilt angle is possible since the gate structure is created after the diffusions, so that shadowing need not be a concern.

A second manner of increasing the breakdown voltage is to provide thicker gate dielectrics. A thicker dielectric film can keep the peak field below wear-out levels. The relative insensitivity of threshold to dielectric thickness can allow thicker dielectrics to be used without the need to change other device parameters.

Empirical Optimization of Trench Depth and Gate Recess

The above-described simulations may be used to improve and preferably optimize the performance of trench gate Fermi-FETs according to embodiments of the present invention, by adjusting the implant doses and energies and the first through third depths. It will be understood, however, that in creating actual devices, it may be difficult to produce this optimization because the actual implanted profiles may not exactly match the theoretical profiles used in the simulation. This may cause the performance to deviate from Equation (5), due to the balance between two counterdoping implant profiles.

In view of this potential difficulty, empirical techniques for balancing the implant parameters and trench depths in actual silicon, now will be described, to allow reduced complexity in the process development effort. In practice, the values of the implants and depths can be arrived at in simulation, as was described above. Then, corrections can be made for actual silicon using the techniques that now will be described.

In particular, test wafers can be fabricated according to the process flow described in FIGS. 12A–12F, without performing the etching step of FIG. 12C. The trench etch of FIG. 12C then can be performed on the whole wafer, stopping at various depths at various locations across the wafer. Following this step, the gate dielectric can either be grown or deposited, and then a gate electrode is applied and patterned, to thereby provide an array of capacitors. Patterning may take place using conventional techniques. FIGS. 18A–18E illustrate various stages of etching that may take place in a single wafer and/or in a series of wafers. As increasing amounts of the wafer surface is etched, the depth of the P/N junction of FIGS. 11A becomes shallower, and the doping of the source/drain layer 125 becomes less as the heavy diffusion is etched away.

Figures 19A, 19B:
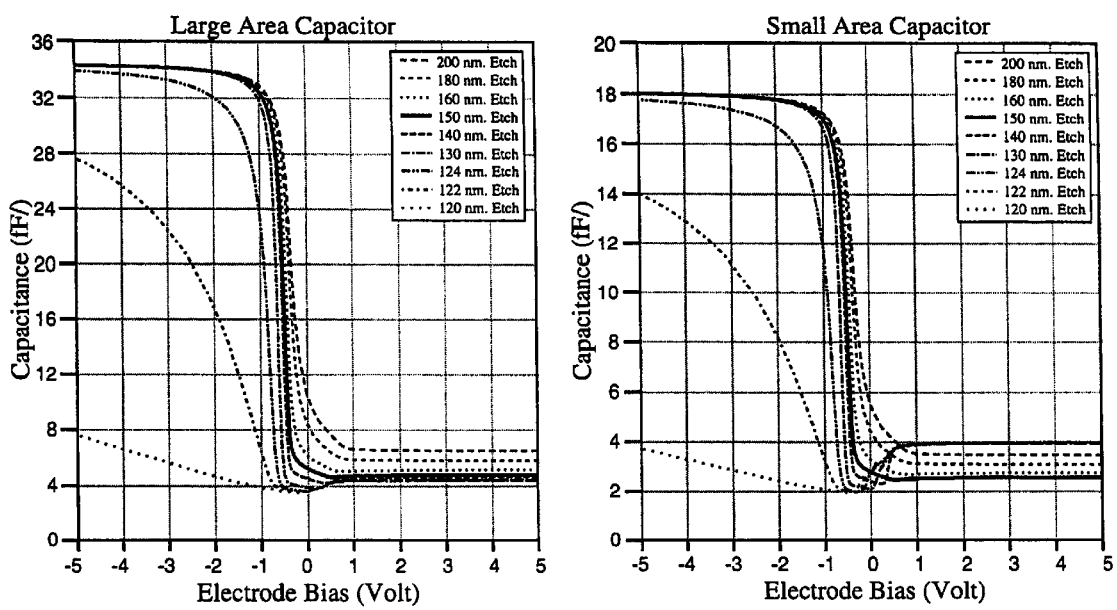
FIGS. 19A and 19B graphically illustrate capacitance vs. voltage plots as a function of the etched amount in FIGS. 18A–18E for a large area capacitor and a small area capacitor, respectively, according to embodiments of the invention.

The behavior of the capacitance vs. voltage (CV) plots as a function of the etched amount depends upon the edge-to-area ratio of the electrode. FIGS. 19A and 19B show simulations of a large area capacitor and a small area capacitor, respectively. A desired etch amount may be determined from FIGS. 19A and 19B.

In particular, by examining the curves of FIGS. 19A and 19B, it is possible to discern the proper trench etch depth for the particular set of implants and thermal cycles that are actually being used. For example, examining the large area-to-periphery curves of FIG. 19A, it can be seen that there is an initial decrease in capacitance on the right hand side of the graph with increasing etch depth. However the capacitance on the left hand side of the graph (negative voltage side) remains pinned at $C_{ox}$. With increasing etch depth, the positive side capacitance reaches a minimum and begins to rise. Further etching does not increase the positive side capacitance, but causes a rapid decrease in the negative side capacitance below $C_{ox}$. The optimum transistor may be obtained with an etch stopped just before the negative side capacitance begins to fall. In FIG. 19A, the optimized Fermi-FET trench depth may be seen as 150 nm. The simulation of the oxide field at threshold of this device shows a vertical component of less than 700V/cm.

Analysis of the small area-to-periphery capacitor (FIG. 19B) shows a slight difference in behavior. However, optimization of the trench depth still may be performed. As in FIG. 19A, the initial etch effect is a decrease in capacitance on the right hand side of the graph with increasing etch depth. Further etching causes a minimum capacitance to be reached on the right hand side. With continued etching, this positive side capacitance rapidly reaches a maximum and becomes pinned. Further etching causes no increase in the positive side capacitance, but a rapid decrease in the negative side capacitance below $C_{ox}$. The optimum transistor may be obtained with an etch stopped just as the positive capacitance reaches maximum but before the negative side capacitance begins to fall. Again, the optimum trench depth is 150 nm. This corresponds to the minimum inversion capacitance curve.

To summarize, the trench depth may be determined by determining a maximum depth that allows a maximum capacitance on the negative side of a capacitance/voltage plot measured on a test capacitor with the same dielectric and gate electrode material used in the actual transistors.

As was also described above, the gate electrode 128 (FIG. 9) preferably is recessed beneath the surface 121a. The gate preferably is recessed beneath the surface by an amount that minimizes capacitance between the insulated gate electrode and the spaced apart source and drain regions, without reducing drain current in the field effect transistor. Derivation of a potentially optimum amount for recessing the gate electrode now will be described.

In particular, for high speed operation, all capacitances preferably are reduced and more preferably are minimized. The diffusion area capacitance may be minimized since the junction is N:P rather than N+:P, by keeping the diffusion region abrupt in the depth direction. This may be done as part of the breakdown voltage optimization. Gate-to-well capacitance already may be low due to the deeper charge centroid of Fermi-FET transistor operation. Thus, the remaining item to optimize is the overlap capacitance between the gate electrode 128 and the source and drain regions 123, 124.

Using a nominal 3.3V version of the device, a series of simulations have been run with various amounts of gate etchback after planarization. The gate recess amount may be defined as $X_j-X_0$ in FIG. 9. Qualitatively, the recess amount is measured from the top surface of the trench after the gate material has been mechanically planarized to be coincident with the top surface of the substrate.

Figure 20A:
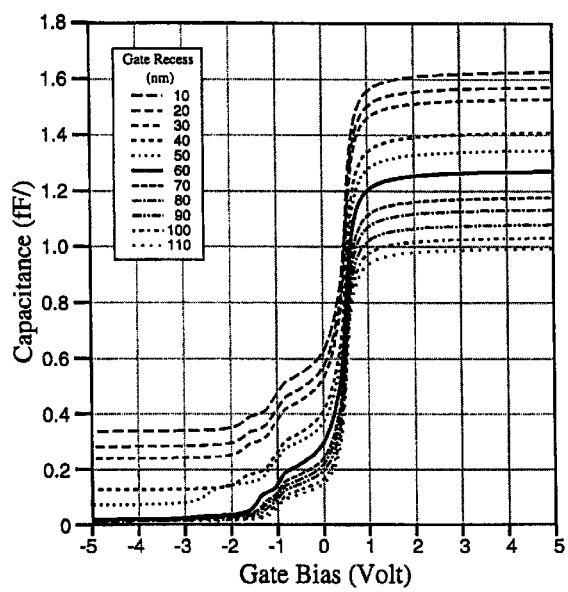
FIG. 20A is a simulated capacitance vs. voltage plot of trench gate Fermi-FET transistors according to embodiments of the invention with different amounts of gate recess.
Figure 20B:
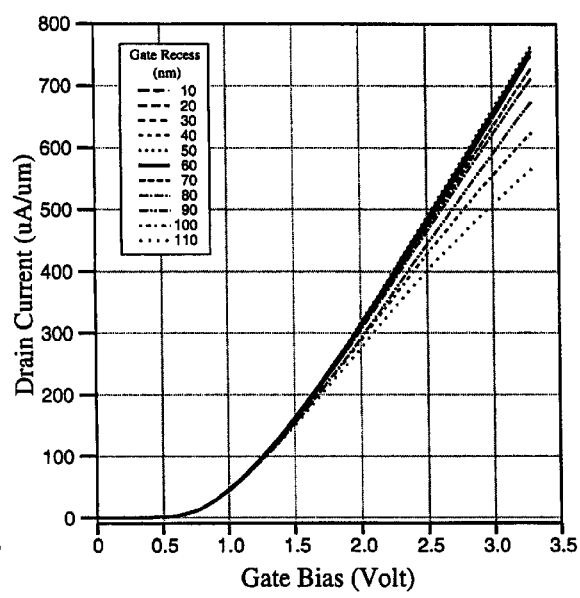
FIG. 20B is a simulated drain current vs. gate bias plot for the transistors that are simulated in FIG. 20A.

FIG. 20A is a simulated capacitance vs. voltage plot of the simulated transistors, with different amounts of gate recess. The drain current vs. gate voltage performance of each of these transistors is shown in FIG. 20B. Referring to FIG. 20A, parasitic capacitance may be optimized by selecting the device with the deepest recess amount before the drive current of FIG. 20B begins to drop off due to increased on-resistance. In FIGS. 20A and 20B, this corresponds to a 60 nm etchback. Note that the total electrode height, prior to any etchback, is 150 nm. With small etchback amounts capable of providing optimal performance, no special provision need be made for contact etching, since the differential between the gate contact height and the contact height to the diffusion areas may be insignificant in most processes.

Figure 21A:
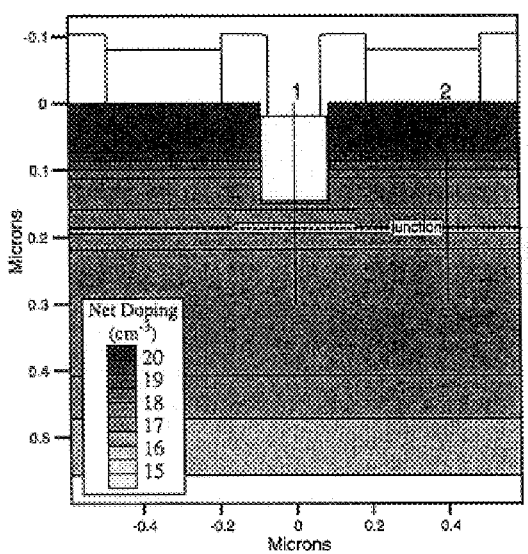
FIGS. 21A and 21B illustrate the final net doping and actual P- and N-type doping profiles, respectively, of trench gate Fermi-FETs according to embodiments of the invention.
Figure 21B:
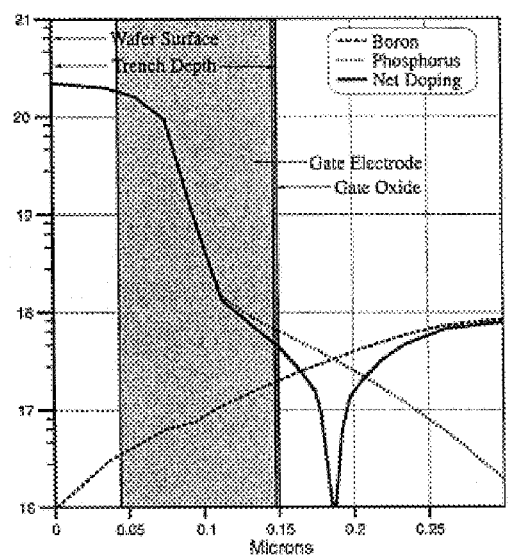

FIG. 21A and 21B illustrate the final net doping and actual P- and N-type doping profiles, respectively, of a device that is optimized according to the procedures described above.

Conclusions

Trench gate Fermi-FETs according to embodiments of the present invention may be particularly well-suited for short channel CMOS devices, for example using subtenth micron line widths. Trench gate Fermi-FETs according to embodiments of the present invention also may be particularly well-suited for high power and/or high speed linear applications, such as may be used in RF amplifiers.

Trench gate Fermi-FETs according to embodiments of the invention may be fabricated with significant process simplification. Halos, extensions and extensive channel engineering need not be used. Short channel effects can be greatly reduced. There may be no need for hyper-shallow source and drain profiles, although these can be provided using high tilt angles. High breakdown voltages may be provided along with lowered source and drain parasitic capacitance. Moreover, the breakdown path is into the bulk silicon, not across the gate dielectric, so that increased reliability may be obtained.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A field effect transistor comprising:
   A semiconductor substrate of a first conductivity type having a planar surface;
   A tub region of a second type in the semiconductor substrate at the planar surface and extending into the semiconductor substrate a first depth from the planar surface;
   Spaced apart source and drain regions of the second conductivity type in the tub region of the second conductivity type at the planar surface and that define single conductivity junctions of the second conductivity type, the spaced apart source and drain regions extending into the tub region a second depth that is less than the first depth;
   A trench in the tub region, between the spaced apart source and drain regions, and extending from the planar surface into the tub region a third depth that is more than the second depth but less than the first depth, wherein the spaced apart source and drain regions extend outside of the trench;
   A gate electrode in the trench; and
   Source and drain electrodes that electrically contact the source and drain regions, respectively.

2. A field effect transistor according to claim 1 wherein at least one of the first, second and third depths are selected to produce zero static electric field perpendicular to the planar surface at the third depth.

3. A field effect transistor according to claim 1 wherein at least one of the first, second and third depths are selected to produce zero static electric field perpendicular to the planar surface at the third depth upon application of the threshold voltage of the field effect transistor to the insulated gate electrode.

4. A field effect transistor according to claim 1 wherein at least one of the first, second and third depths are selected to produce a threshold voltage for the field effect transistor that is twice the Fermi potential of the semiconductor substrate.

5. A field effect transistor according to claim 1 wherein at least one of the first, second and third depths are selected to allow carriers of the second conductivity type to flow in the tub region, beneath the trench at the third depth upon application of the threshold voltage of the field effect transistor to the gate electrode.

6. A field effect transistor according to claim 1 wherein at least one of the first, second and third depths are selected to allow carriers of the second conductivity type to flow in the tub region, beneath the trench and extending from the third depth towards the first depth upon application of voltage to the gate electrode beyond the threshold voltage of the field effect transistor.

7. A field effect transistor according to claim 1 wherein at least one of the first, second and third depths are selected to form a channel in the tub region at the third depth, beneath the trench.

8. A field effect transistor according to claim 1 wherein the trench defines a trench width and wherein at least one of the first, second and third depths are selected to form a channel in the tub region beneath the trench and having a channel length that is proportional to the trench width and is independent of a difference between the first depth and the second depth.

9. A field effect transistor according to claim 1 wherein at least one of the first, second and third depths are selected to deplete the tub region beneath the trench from the third depth to the first depth.

10. A field effect transistor according to claim 1 wherein the trench includes a trench floor, wherein the insulated gate includes an insulating layer having a thickness on the trench floor and a gate electrode on the insulating layer opposite the trench floor, and wherein at least one of the first, second and third depths are selected to produce a threshold voltage for the field effect transistor that is independent of the thickness of the insulating layer on the trench floor.

11. A field effect transistor according to claim 1 wherein the trench defines a trench width and wherein at least one of the first, second and third depths are selected to form a channel in the tub region upon application of the threshold voltage of the field effect transistor to the gate electrode, that is confined to beneath the trench and extends across the trench width and having uniform thickness beneath he trench and across the trench width.

12. A field effect transistor according to claim 1 wherein the third depth is less that the first depth by an amount that is equal to:

$$\sqrt{\frac{2\varepsilon_s kT}{q}\left(\frac{N_a}{N_d N_a + N_d^2}\right)\ln\left(\frac{N_d N_a}{n_i^2}\right)},$$

where $N_d$ is the doping density of the tub region, $N_a$ is the doping density of the semiconductor substrate, $N_i$ is the intrinsic carrier concentration of the substrate at temperature T degrees Kelvin, $\varepsilon_s$ is the permittivity of the substrate, q is $1.6 \times 10^{-19}$ coulombs and k is $1.38 \times 10^{-23}$ Joules/degree Kelvin.

13. A field effect transistor according to claim 1 wherein the semiconductor substrate of first conductivity type is a well region of first conductivity type in a substrate of second conductivity type, at the planar surface, and wherein the tub region of second conductivity type is in the well region at the planar surface and extends into the well region a first depth from the planar surface.

14. A field effect transistor according to claim 1 wherein the insulated gate electrode is in the trench and is recessed beneath the planar surface.

15. A field effect transistor according to claim 14 wherein the insulated gate electrode is in the trench and is recessed beneath the planar surface by an amount that minimizes capacitance between the insulated gate electrode and the spaced apart source and drain regions without reducing drain current in the field effect transistor.

16. A field effect transistor according to claim 1 wherein at least one of the first, second and third depths are selected to produce a static electric field of less than 700 volts per centimeter perpendicular to the planar surface at the third depth.

17. A field effect transistor according to claim 1 wherein at least one of the first, second and third depths are selected to produce a static electric field of less than 700 volts per centimeter perpendicular to the planar surface at the third depth upon application of the threshold voltage of the field effect transistor to the insulated gate electrode.

18. A field effect transistor according to claim 1 wherein at least one of the first, second and third depths are selected to produce a static electric field perpendicular to the planar surface at the third depth that is at least an order of magnitude less than that produced by a field effect transistor that does not include the tub region.

19. A field effect transistor according to claim 1 wherein at least one of the first, second and third depths are selected to produce a static electric field perpendicular to the planar surface at the third depth upon application of the threshold voltage of the field effect transistor to the insulated gate electrode that is at least an order of magnitude less than that produced by a field effect transistor that does not include the tub region.

20. A field effect transistor according to claim 1 wherein at least one of the first, second and third depths are selected to produce a static electric field perpendicular to the planar surface at the third depth that is less than half of that produced by a field effect transistor that does not include the tub region.

21. A field effect transistor according to claim 1 wherein at least one of the first, second and third depths are selected to produce a static electric field perpendicular to the planar surface at the third depth upon application of the threshold voltage of the field effect transistor to the insulated gate electrode that is less than half of that produced by a field effect transistor that does not include the tub region.

22. A field effect transistor according to claim 1 wherein at least one of the first, second and third depths are selected to produce a static electric field perpendicular to the planar surface at the third depth that is less than one fifth of that produced by a field effect transistor that does not include the tub region.

23. A field effect transistor according to claim 1 wherein at least one of the first, second and third depths are selected to produce a static electric field perpendicular to the planar surface at the third depth upon application of the threshold voltage of the field effect transistor to the insulated gate electrode that is less than one fifth of that produced by a field effect transistor that does not include the tub region.

24. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce zero static electric field perpendicular to the planar surface at the third depth.

25. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce zero static electric field perpendicular to the planar surface at the third depth upon application of the threshold voltage of the field effect transistor to the insulated gate electrode.

26. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce a threshold voltage for the field effect transistor that is twice the Fermi potential of the semiconductor substrate.

27. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to allow carriers of the second conductivity type to flow in the tub region, beneath the trench at the third depth upon application of the threshold voltage of the field effect transistor to the gate electrode.

28. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce a static electric field of less than 700 volts per centimeter perpendicular to the planar surface at the third depth.

29. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce a static electric field of less than 700 volts per centimeter perpendicular to the planar surface at the third depth upon application of the threshold voltage of the field effect transistor to the insulated gate electrode.

30. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce a static electric field perpendicular to the planar surface at the third depth that is at least an order of magnitude less than that produced by a field effect transistor that does not include the tub region.

31. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce a static electric field perpendicular to the planar surface at the third depth upon application of the threshold voltage of the field effect transistor to the insulated gate electrode that is at least an order of magnitude less than that produced by a field effect transistor that does not include the tub region.

32. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to allow carriers of the second conductivity type to flow in the tub region, beneath the trench and extending from the third depth towards the first depth upon application of voltage to the gate electrode beyond the threshold voltage of the field effect transistor.

33. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to form a channel in the tub region at the third depth, beneath the trench.

34. A field effect transistor according to claim 1 wherein the trench defines a trench width wherein the semiconductor substrate is doped the first conductivity type at a first doping density, wherein the tub region is doped the second conductivity type at a second doping density, and wherein at least one of the first, second and third depths and the first and second doping densities are selected to form a channel in the tub region beneath the trench and having a channel length that is proportional to the trench width and is independent of a difference between the first depth and the second depth.

35. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to deplete the tub region beneath the trench from the third depth to the first depth.

36. A field effect transistor according to claim 1 wherein the trench includes a trench floor, wherein the insulated gate includes an insulating layer having a thickness on the trench floor and a gate electrode on the insulating layer opposite the trench floor, wherein the semiconductor substrate is doped the first conductivity type at a first doping density, wherein the tub region is doped the second conductivity type at a second doping density, and wherein at least one of the first, second and third depths and the first and second doping densities are selected to produce a threshold voltage for the field effect transistor that is independent of the thickness of the insulating layer on the trench floor.

37. A field effect transistor according to claim 1 wherein the trench defines a trench width wherein the semiconductor substrate is doped the first conductivity type at a first doping density, wherein the tub region is doped the second conductivity type at a second doping density, and wherein at least one of the first, second and third depths and the first and second doping densities are selected to form a channel in the tub region upon application of the threshold voltage of the field effect transistor to the gate electrode, that is confined to beneath the trench and extends across the trench width and having uniform thickness beneath the trench and across the trench width.

38. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce a static electric field perpendicular to the planar surface at the third depth that is less than half of that produced by a field effect transistor that does not include the tub region.

39. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce a static electric field perpendicular to the planar surface at the third depth upon application of the threshold voltage of the field effect transistor to the insulated gate electrode that is less than half of that produced by a field effect transistor that does not include the tub region.

40. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce a static electric field perpendicular to the planar surface at the third depth that is less than one fifth of that produced by a field effect transistor that does not include the tub region.

41. A field effect transistor according to claim 1 wherein the semiconductor substrate is doped the first conductivity type at a first doping density, wherein the tub region is doped the second conductivity type at a second doping density, and wherein at least one of the first, second and third depths and the first and second doping densities are selected to produce a static electric field perpendicular to the planar surface at the third depth upon application of the threshold voltage of the field effect transistor to the insulated gate electrode that is less than one fifth of that produced by a field effect transistor that does not include the tub region.

* * * * *